(12) United States Patent
Kim

(10) Patent No.: US 12,009,297 B2
(45) Date of Patent: Jun. 11, 2024

(54) SEMICONDUCTOR DEVICE AND SEMICONDUCTOR PACKAGE

(71) Applicant: SAMSUNG ELECTRONICS CO., LTD., Suwon-si (KR)

(72) Inventor: Morae Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 252 days.

(21) Appl. No.: 17/551,374

(22) Filed: Dec. 15, 2021

(65) Prior Publication Data

US 2022/0199518 A1    Jun. 23, 2022

(30) Foreign Application Priority Data

Dec. 17, 2020 (KR) ......................... 10-2020-0177634

(51) Int. Cl.
 *H01L 23/528* (2006.01)
 *H01L 23/00* (2006.01)
 *H01L 25/065* (2023.01)

(52) U.S. Cl.
 CPC ............ *H01L 23/528* (2013.01); *H01L 24/05* (2013.01); *H01L 24/13* (2013.01); *H01L 24/26* (2013.01); *H01L 25/0655* (2013.01); *H01L 2224/0401* (2013.01); *H01L 2224/13026* (2013.01); *H01L 2224/16227* (2013.01)

(58) Field of Classification Search
 CPC .................................................... H01L 23/528
 See application file for complete search history.

(56) References Cited

U.S. PATENT DOCUMENTS

| | | | |
|---|---|---|---|
| 7,618,877 B2 | 11/2009 | Onuma | |
| 8,633,086 B2 | 1/2014 | Kalnitsky et al. | |
| 9,385,007 B2 | 7/2016 | Terai et al. | |
| 10,643,911 B2 | 5/2020 | Tang | |
| 10,651,105 B2 | 5/2020 | Kim et al. | |
| 2019/0051626 A1* | 2/2019 | Fang | ................... H01L 23/5389 |
| 2020/0020604 A1* | 1/2020 | Kim | ....................... H01L 22/32 |

FOREIGN PATENT DOCUMENTS

| | | |
|---|---|---|
| JP | 2004-253678 | 9/2004 |
| KR | 10-2003-0048207 | 6/2003 |
| KR | 10-2004-0006420 | 1/2004 |
| KR | 10-2011-0083278 | 7/2011 |
| KR | 10-2020-0007217 | 1/2020 |

* cited by examiner

*Primary Examiner* — William A Harriston
(74) *Attorney, Agent, or Firm* — F. Chau & Associates, LLC

(57) ABSTRACT

A semiconductor device includes a semiconductor substrate having a semiconductor device on an active surface thereof. The semiconductor substrate has a quadrangular plane. An insulating layer is on the active surface of the semiconductor substrate. A passivation layer is on the insulating layer. The insulating layer includes an insulating layer central portion having a side surface extending in parallel with a side surface of the semiconductor substrate. The side surface of the insulating layer central portion is spaced apart from the side surface of the semiconductor substrate by a first size. An insulating layer corner portion is at each corner of the insulating layer central portion and protrudes from the side surface of the insulating layer central portion in a horizontal direction. The passivation layer covers the insulating layer central portion.

20 Claims, 18 Drawing Sheets

SEMICONDUCTOR DEVICE AND SEMICONDUCTOR PACKAGE

CROSS-REFERENCE TO RELATED APPLICATION

This application claims priority under 35 U.S.C. § 119 to Korean Patent Application No. 10-2020-0177634, filed on Dec. 17, 2020 in the Korean Intellectual Property Office, the disclosure of which is incorporated by reference in its entirety herein.

1. Technical Field

The present inventive concepts relate to a semiconductor device and a semiconductor package, and more particularly, to a semiconductor device and a semiconductor package, which have high reliability and as low failure rate.

2. Discussion of Related Art

As the integration density and precision of semiconductor devices have increased so has the demand for high reliability of the semiconductor devices. There has been increased efforts in developing manufacturing processes to provide semiconductor devices having high reliability. There has also been increased efforts in developing a process of singulating a wafer into semiconductor chips.

SUMMARY

The present inventive concepts provide a semiconductor device having high reliability and a low failure rate.

The present inventive concepts also provide a semiconductor package having high reliability and a low failure rate.

According to an embodiment of the present inventive concepts, a semiconductor device includes a semiconductor substrate having a semiconductor device on an active surface thereof. The semiconductor substrate has a quadrangular plane. An insulating layer is on the active surface of the semiconductor substrate. A passivation layer is on the insulating layer. The insulating layer includes an insulating layer central portion having a side surface extending in parallel with a side surface of the semiconductor substrate. The side surface of the insulating layer central portion is spaced apart from the side surface of the semiconductor substrate by a first size. An insulating layer corner portion is at each corner of the insulating layer central portion and protrudes from the side surface of the insulating layer central portion in a horizontal direction. The passivation layer covers the insulating layer central portion.

According to an embodiment of the present inventive concepts, a semiconductor package includes a semiconductor substrate. An insulating layer covers an active surface of the semiconductor substrate and has a protrusion at each of four corners thereof. The protrusion protrudes in a horizontal direction. A passivation layer at least partially covers the insulating layer. At least a portion of an edge of the protrusion is aligned with an edge of the semiconductor substrate.

According to an embodiment of the present inventive concepts, a semiconductor package includes a semiconductor substrate having a semiconductor device on an active surface thereof. The semiconductor substrate has a quadrangular plane. An insulating layer is on the active surface of the semiconductor substrate and includes a wiring layer electrically connected to the semiconductor device. A passivation layer is on the insulating layer and exposes a connection pad electrically connected to the wiring layer. A connector is on the connection pad. A package molding layer covers at least a portion of the semiconductor substrate. The insulating layer includes an insulating layer central portion having a side surface extending in parallel with a side surface of the semiconductor substrate. The side surface of the insulating layer central portion is spaced apart from the side surface of the semiconductor substrate by a first size. An insulating layer corner portion is at each corner of the insulating layer central portion, protruding from the side surface of the insulating layer central portion, and has a side surface aligned with the side surface of the semiconductor substrate. The passivation layer covers the insulating layer central portion and the insulating layer corner portion and has a side surface aligned a side surface of the insulating layer.

According to an embodiment of the present inventive concepts, a wafer has a plurality of scribe lanes for singulating the wafer into a plurality of semiconductor chips. Each of the plurality of semiconductor chips are defined by a chip region. Each of the plurality of semiconductor chips includes a semiconductor substrate having an active surface. An insulating layer is on the active surface of the semiconductor substrate. A passivation layer is on the insulating layer. The insulating layer and the passivation layer are not disposed on portions of the plurality of scribe lanes. The insulating layer and the passivation layer are disposed on a cross region where the plurality of scribe lanes intersect each other. The insulating layer and the passivation layer are continuously connected in a first chip region and a second chip region that is adjacent to the first chip region.

BRIEF DESCRIPTION OF THE DRAWINGS

Embodiments of the present inventive concepts will be more clearly understood from the following detailed description taken in conjunction with the accompanying drawings in which.

DETAILED DESCRIPTION OF EMBODIMENTS

Figure 1:
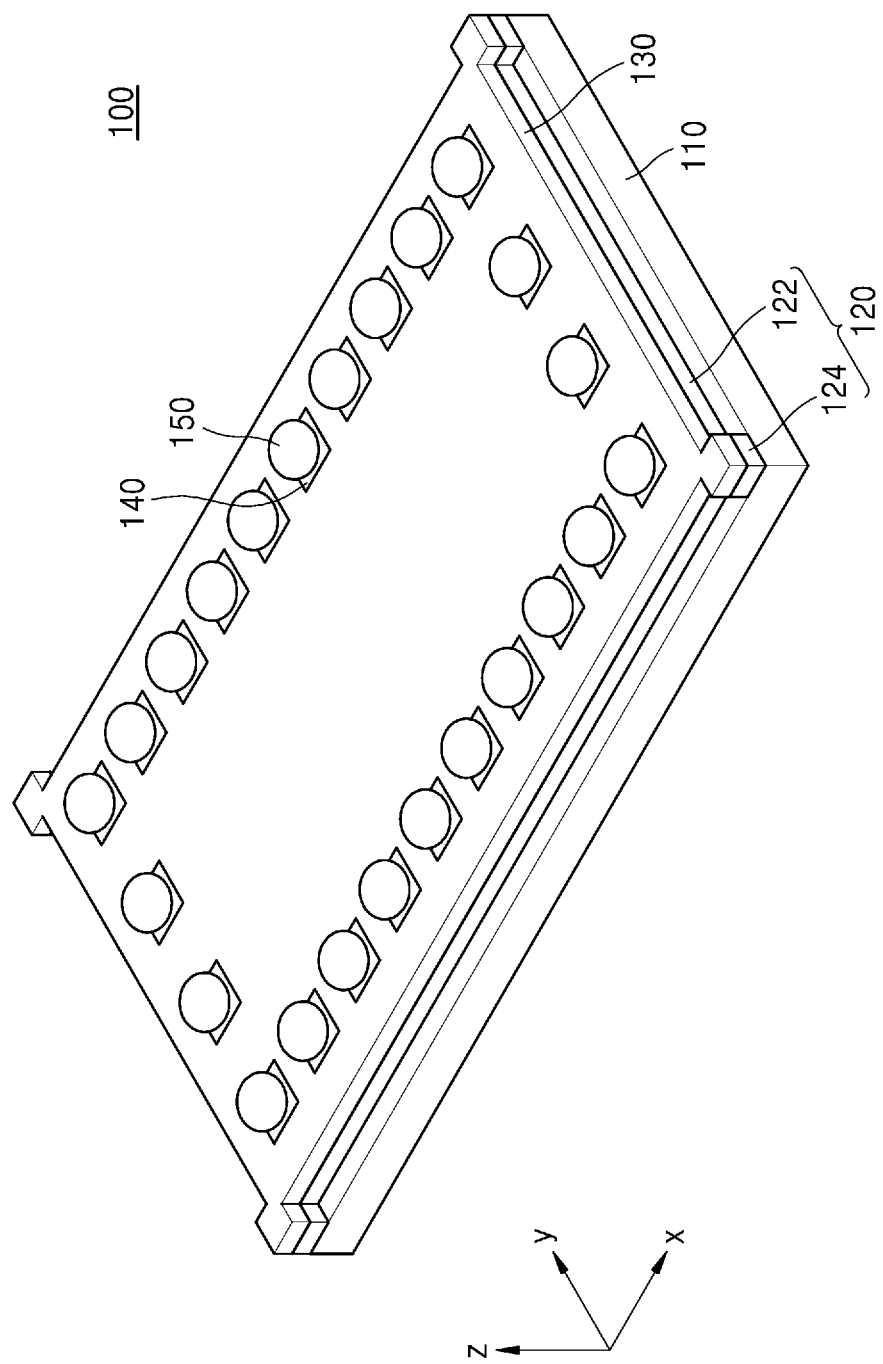
FIG. 1 is a perspective view of a main part of a semiconductor device according to an embodiment of the present inventive concepts.

Hereinafter, embodiments will be described in detail with reference to the accompanying drawings. In the drawings, like reference numerals denote like elements, and redundant descriptions thereof are omitted.

Figure 2:
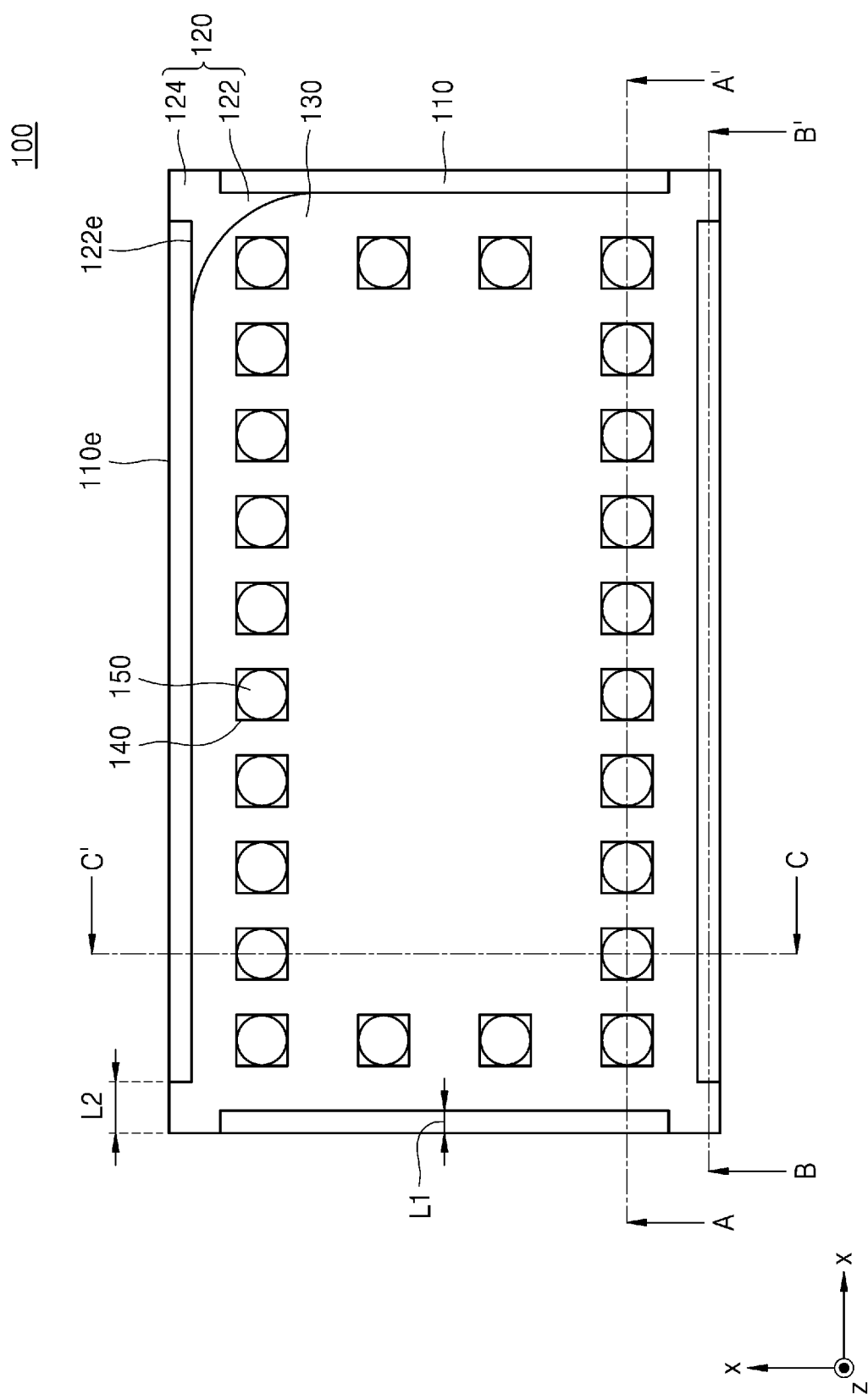
FIG. 2 is a plan view of a main part of a semiconductor device according, to an embodiment of the present inventive concepts.
Figure 3A:
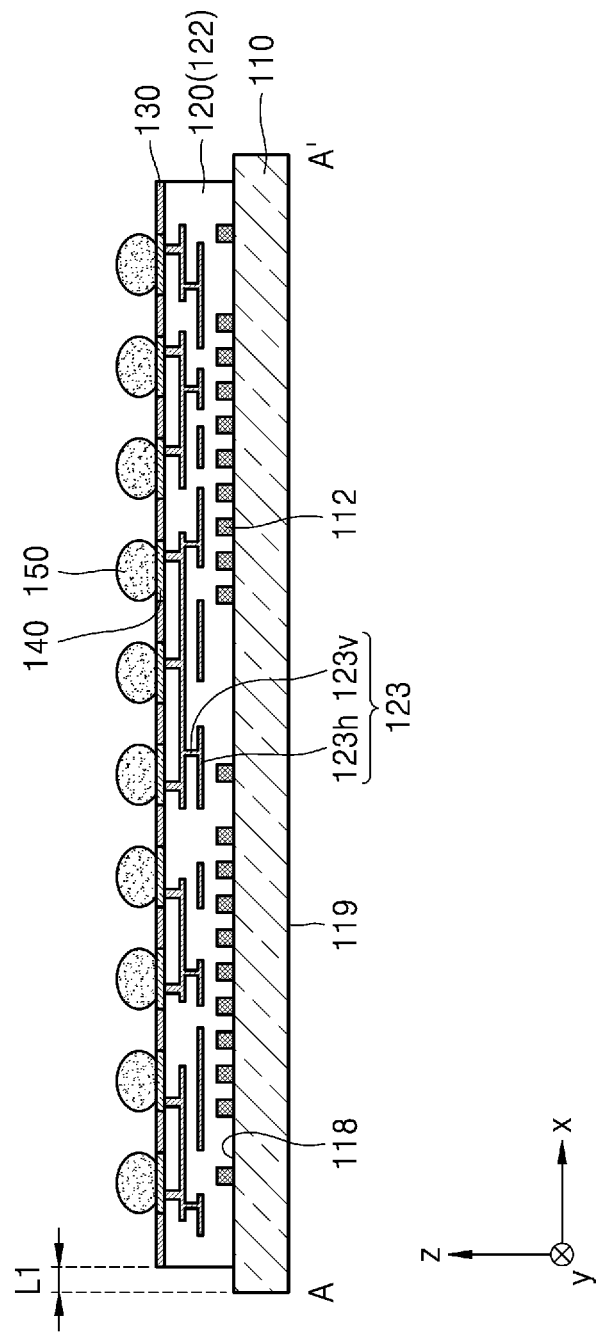
FIGS. 3A through 3C are lateral cross-sectional views respectively taken along lines A-', B-B', and C-C' in FIG. 2 according to embodiments of the present inventive concepts.
Figure 3B:
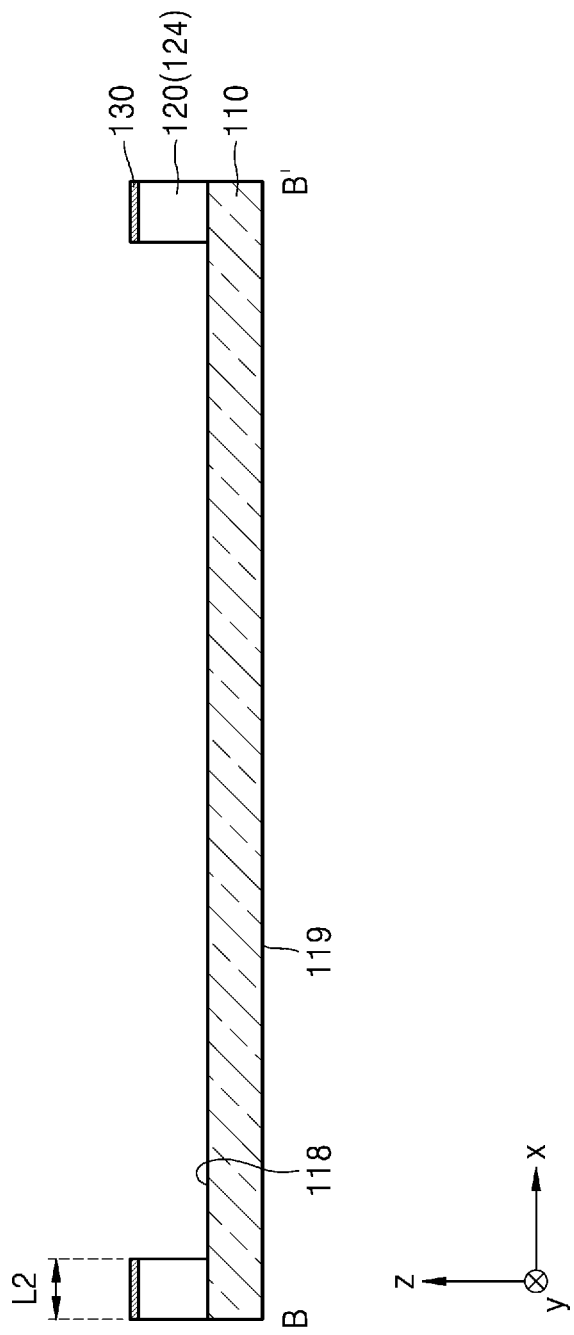
Figure 3C:
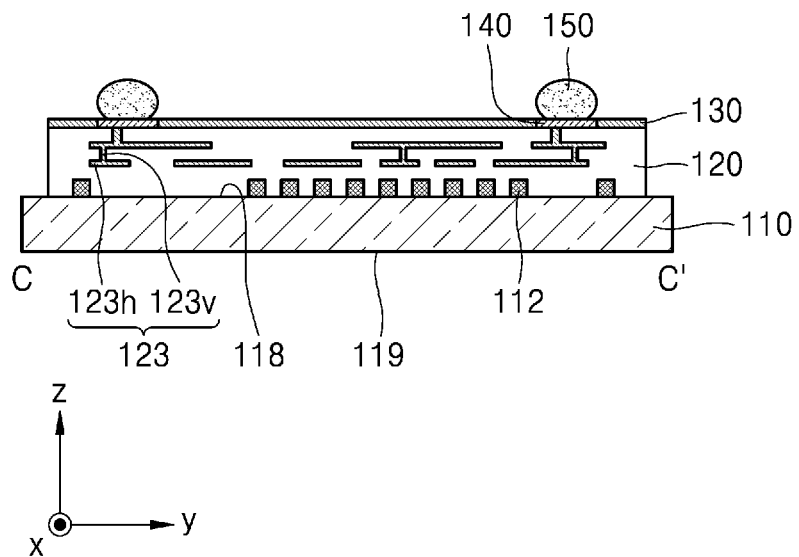

FIG. 1 is a perspective view of a main pan of a semiconductor device 100 according to an embodiment. FIG. 2 is a plan view of the main part of the semiconductor device 100 according to an embodiment. FIGS. 3A through 3C are lateral cross-sectional views respectively taken along lines A-A' B-B', and C-C' in FIG. 2.

Referring to the embodiments of FIGS. 1 through 3C, the semiconductor device 100 includes a semiconductor substrate 110, which has semiconductor devices 112 disposed on an active surface 118, an insulating layer 120 disposed on the active surface 118 and the semiconductor devices 112, and a passivation layer 130 disposed on the insulating layer 120. As shown in the embodiments of FIGS. 1-2, the semiconductor substrate 110 may have a quadrangular plane having a relatively long side extending in a direction parallel to the x axis (hereinafter, the "X direction") and a relatively short side extending in a direction parallel to the y axis (hereinafter, the "Y direction"). However, embodiments of the present inventive concepts are not limited thereto and the semiconductor substrate 110 may have a quadrangular plane shape that is variously arranged.

For example, in an embodiment the semiconductor substrate 110 may include a semiconductor material such as silicon (Si). The semiconductor substrate 110 may include a semiconductor element, such as germanium (Ge) or a compound semiconductor such as at least one compound selected from silicon carbide (SiC), gallium arsenide (GaAs), indium arsenide (InAs), or indium phosphide (InP). The semiconductor substrate 110 may have the active surface 118 and an inactive surface 119 opposite the active surface 118 in a third direction that is a vertical direction parallel to the z axis (hereinafter, the "Z direction"). In an embodiment, the Z direction may be perpendicular to the X direction and the Y direction. The semiconductor substrate 110 may include a conductive region, such as an impurity doped well. The semiconductor substrate 110 may have various isolation structures including a shallow trench isolation (STI) structure.

In this specification, a top surface and a bottom surface of the semiconductor substrate 110 respectively refer to a side of the active surface 118 and a sick of the inactive surface 119 of the semiconductor substrate 110. For example, even when the active surface 118 of a semiconductor substrate is positioned below the inactive surface 119 in an end product, the side of the active surface 118 of the semiconductor substrate is referred to as the top surface and the side of the inactive surface 119 of the semiconductor substrate is referred to as the bottom surface in this specification. Therefore, the term "top" may be used for elements located active surface 118 of a semiconductor substrate and the term "bottom" may be used for elements located on the inactive surface 119 of a semiconductor substrate for convenience of description and not limitation.

The semiconductor devices 112 including various kinds of individual devices may be disposed on the active surface 118 of the semiconductor substrate 110 (e.g., directly thereon in the Z direction). In an embodiment, the individual devices of die semiconductor devices 112 may include various microelectronic devices, such as a metal-oxide-semiconductor field effect transistor (MOSFET) such as a complementary metal-oxide semiconductor (CMOS) transistor, a system large scale integration (LSI), an image sensor such as a CMOS image sensor (CIS), a micro-electro-mechanical system (MEMS), an active element, and a passive element. However, embodiments of the present inventive concepts are not limited thereto. The individual devices of the semiconductor devices 112 may be electrically connected to the conductive region of the semiconductor substrate 110. In an embodiment, each of the semiconductor devices 112 may include at least two individual devices and may further include a conductive wire or a conductive plug, which electrically connects each individual device to the conductive region of the semiconductor substrate 110. Each of the individual devices may be electrically isolated from an adjacent individual device by an insulating film.

For example, in an embodiment, the semiconductor substrate 110 may include a dynamic random access memory (DRAM) chip, a static RAM (SRAM) chip, a flash memory chip, an electrically erasable and programmable ROM (EEPROM) chip, a phase-change RAM (PRAM) chip, a magnetic RAM (MRAM) chip, or a resistive RAM (RRAM) chip. For example, the semiconductor substrate 110 may include a central processing unit (CPU) chip, a graphics processing unit (GPU) chip, or an application processor (AP) chip. However, embodiments of the present inventive concepts are not limited thereto.

In an embodiment, the semiconductor substrate 110 may include a high-bandwidth memory (HBM) DRAM semiconductor chip. In an embodiment, the semiconductor substrate 110 may include a buffer chip including a serial-parallel conversion circuit. In an embodiment, the semiconductor substrate 110 may include a buffer chip for controlling an HBM DRAM semiconductor chip. In an embodiment in which the semiconductor substrate 110 includes a buffer chip for controlling an HBM DRAM semiconductor chip, the semiconductor substrate 110 may be called a master chip and the HBM DRAM semiconductor chip may be called a slave chip.

In an embodiment, the insulating layer 120 may include silicon oxide and/or silicon nitride. In some embodiments, the insulating layer 120 may include tetraethyl orthosilicate (TEOS). In some embodiments, the insulating layer 120 may include an insulating material that has a lower permittivity than silicon oxide. For example, the insulating layer 120 may include an ultra low-k (ULK) film that has an ultra low dielectric constant in a range of about 2.2 to about 2.4. The ULK film may include an SiOC film or an SiCOH film. In some embodiments, the insulating layer 120 may have a multi-layer structure, in which a plurality of insulating material layers are stacked.

The insulating layer 120 may have at least one wiring layer 123 disposed therein (e.g., disposed on an inside of the insulating layer 120). The wiring layer 123 may include a horizontal pattern 123h, which extends in a horizontal direction such as the X direction and/or the Y direction, and a vertical via 123v, which extends in a vertical direction (e.g., the Z direction) to connect the horizontal patterns 123h to each other. In an embodiment, each of the horizontal pattern 123h and the vertical via 123v may include copper, nickel, gold, platinum, palladium, titanium, an alloy thereof, or a stack thereof. However, embodiments of the present inventive concepts are not limited thereto.

The insulating layer 120 may include an insulating layer central portion 122 and an insulating layer corner portion 124. To clearly show the insulating layer central portion 122 and the insulating layer corner portion 124 in FIG. 2, the right upper corner of the passivation layer 130 is partially removed. However, the structure of the pass nation layer 130 is not limited thereby. The insulating layer corner portion 124 may protrude from the insulating layer central portion 122 in the horizontal direction (e.g., the X direction and/or the Y direction) in each corner of the insulating layer 120. The insulating layer corner portion 124 may be referred to as a "protrusion" below.

In some embodiments, the insulating layer central portion 122 and the insulating layer corner portion 124 may include the same material as each other. In some embodiments, the insulating layer central portion 122 and the insulating layer corner portion 124 may be integrally formed with each other. However, embodiments of the present inventive concepts are not limited thereto.

Each of edges 122e of the insulating layer central portion 122 may extend substantially in parallel with a corresponding edge 110e of the semiconductor substrate 110. Each edge 122e of the insulating layer central portion 122 may retreat from (e.g., be spaced apart from in a horizontal direction) a corresponding edge 110e of the semiconductor substrate 110 by a first size L1 toward the center of the insulating layer central portion 122. In an embodiment, the first size L1 may be in a range of about 4 micrometers (μm) to about 20 μm. However, embodiments of the present inventive concepts are not limited thereto. In an embodiment the first size L1 may not be the same with respect to all four edges of the insulating layer central portion 122. Furthermore, the first size L1 may be slightly different at different positions in one edge.

Figure 4:
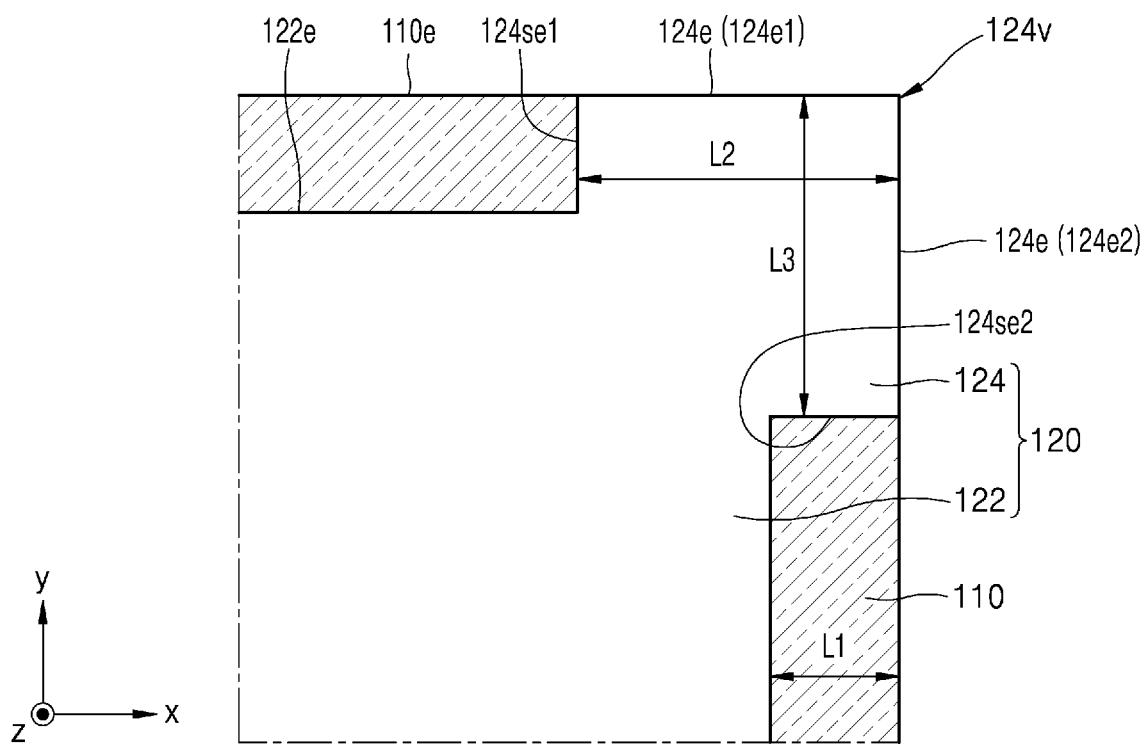
FIG. 4 is a detailed plan view of an insulating layer central portion and an insulating layer corner portion, according to an embodiment of the present inventive concepts.

The insulating layer corner portion 124 may protrude from the insulating layer central portion 122 in a lateral direction (e.g., a horizontal direction) in each of the four corners of the insulating layer 120. FIG. 4 is a detailed plan view of the insulating layer central portion 122 and the insulating layer corner portion 124, according to an embodiment of the present inventive concepts.

Referring to the embodiment of FIG. 4, the insulating layer corner portion 124 includes an edge 124e, which extends in parallel with the edge 110e of the semiconductor substrate 110 and overlaps the edge 110e of the semiconductor substrate 110 (e.g., in the Z direction). For example, a side surface of the insulating layer corner portion 124 contacting the edge 124e may be aligned with a side surface of the semiconductor substrate 110.

The insulating layer corner portion 124 may include a first edge 124e1, which extends in the X direction, and a second edge 124e2, which extends in the direction. The first edge 124e1 may meet the second edge 124e2 at an insulating layer vertex 124v. The insulating layer vertex 124v may be aligned with a vertex of the semiconductor substrate 110 in the Z direction.

The insulating layer corner portion 124 includes a first sub-edge 124se1 adjacent to the first edge 124e1. As shown in the embodiment of FIG. 4, the extension direction of the first sub-edge 124se1 is different from the extension direction of the first edge 124e1. In an embodiment, the extension direction of the first sub-edge 124se1 may be perpendicular to the extension direction of the first edge 124e1. For example, in an embodiment, the extension direction of the first sub-edge 124se1 may correspond to the Y direction. The first sub-edge 124se1 may meet an edge of the insulating layer central portion 122, which extends in the X direction.

The insulating layer corner portion 124 includes a second sub-edge 124se2 adjacent to the second edge 124e2. As shown in the embodiment of FIG. 4, the extension direction of the second sub-edge 124se2 is different from the extension direction of the second edge 124e2. In some embodiments, the extension direction of the second sub-edge 124se2 may be perpendicular to the extension direction of the second edge 124e2. For example, in an embodiment, the extension direction of the second sub-edge 174se2 may correspond to the X direction. The second sub-edge 174se2 may meet an edge of the insulating layer central portion 122, which extends in the Y direction.

In some embodiments, the insulating layer corner portion 124 may have a width of a second size L2 in the X direction. For example, a distance (e.g length in the X direction) between the first sub-edge 124se1 and the second edge 124e2 may correspond to the second size L2.

In an embodiment, the insulating layer corner portion 124 may have a width of a third size L3 in the Y direction. For example, a distance (e.g., length in the Y direction) between the second stab-edge 124se2 and the first edge 124e1 may correspond to the third size L3.

In an embodiment, the second size L2 may be substantially the same as the third size L3. However, embodiments of the present inventive concepts are not limited thereto. For example, in some embodiments, the second size L2 may be different from the third size L3. In some embodiments, each of the second size L2 and the third size L3 may be greater than the first size L1. In some embodiments, each of the second size L2 and the third, size L3 may be independently in ranges of about 1 to about 5 times, about 1.1 to about 4.5 times, about 1.2 to about 4 times, about 1.3 to about 3.5 times, or about 1.4 to about 3 times the first size L1. In some embodiments, each of the second size L2 and the third size L3 may be independently in ranges of about 4 μm to about 100 μm, about 7 μm to about 95 μm, about 10 μm to about 90 μm, about 12 μm to about 85 μm, about 15 μm to about 80 μm, about 18 μm to about 75 μm, about 20 μm to about 70 μm, about 22 μm to about 65 μm, or about 25 μm to about 60 μm. However, embodiments of the present inventive concepts are not limited thereto. For example, in some embodiments, each of the second size L2 and the third size L3 may independently have a random range within the above figures.

FIGS. 5A through 5D are detailed plan views of the insulating layer corner portion 124, according to embodiments.

Figure 5A:
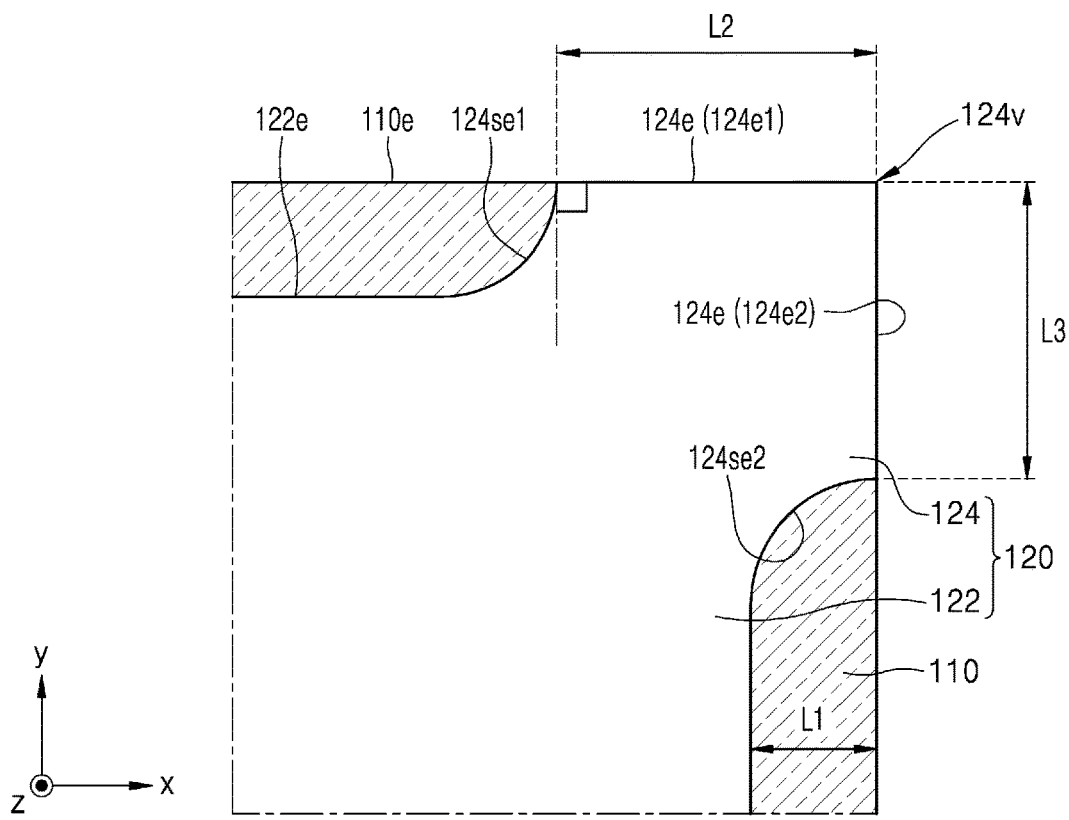
FIGS. 5A through 5D are detailed plan views of an insulating layer corner portion, according to embodiments of the present inventive concepts.

The insulating layer corner portion 124 of FIG. 5A is the same as the insulating layer corner portion 124 described above with reference to FIG. 4, except for the shape of the first sub-edge 124se1 and the shape of the second sub-edge 124se2. Thus, descriptions below will be focused on this difference and a repeated description of similar or identical elements may be omitted for convenience of explanation.

Referring to the embodiment of FIG. 5A, the first edge 124e1 of the insulating layer corner portion 124 may have the second size L2 the X direction, and the second edge 124e2 of the insulating layer corner portion 124 may have the third size L3 in the Y direction. The first sub-edge 124se1 may be adjacent and connected to the first edge 124e1, and the second sub-edge 124se2 may be adjacent and connected to the second edge 124e2.

As shown in the embodiment of FIG. 5A, each of the first sub-edge 124se1 and the second sub-edge 124se2 may form a curve. For example, a side surface of the insulating layer corner portion 124 contacting each of the first sub-edge 124se1 and the second sub-edge 124se2 may include a curved surface.

In an embodiment, each of the first sub-edge 124se1 and the second sub-edge 124se2 may form a concave curve.

In some embodiments, each of the first sub-edge 124se1 and the second sub-edge 124se2 may include a quadrant, which is an arc having the first size L1 as the radius of curvature. In the embodiment shown in FIG. 5A, the first sub-edge 124se1 may be positioned at a right angle with respect to the first edge. 124e1. In the present embodiment, an angle between a curve and a straight line may be defined as an angle between the straight line and the tangent of the curve at the intersection of the curve and the straight line.

Figure 5B:
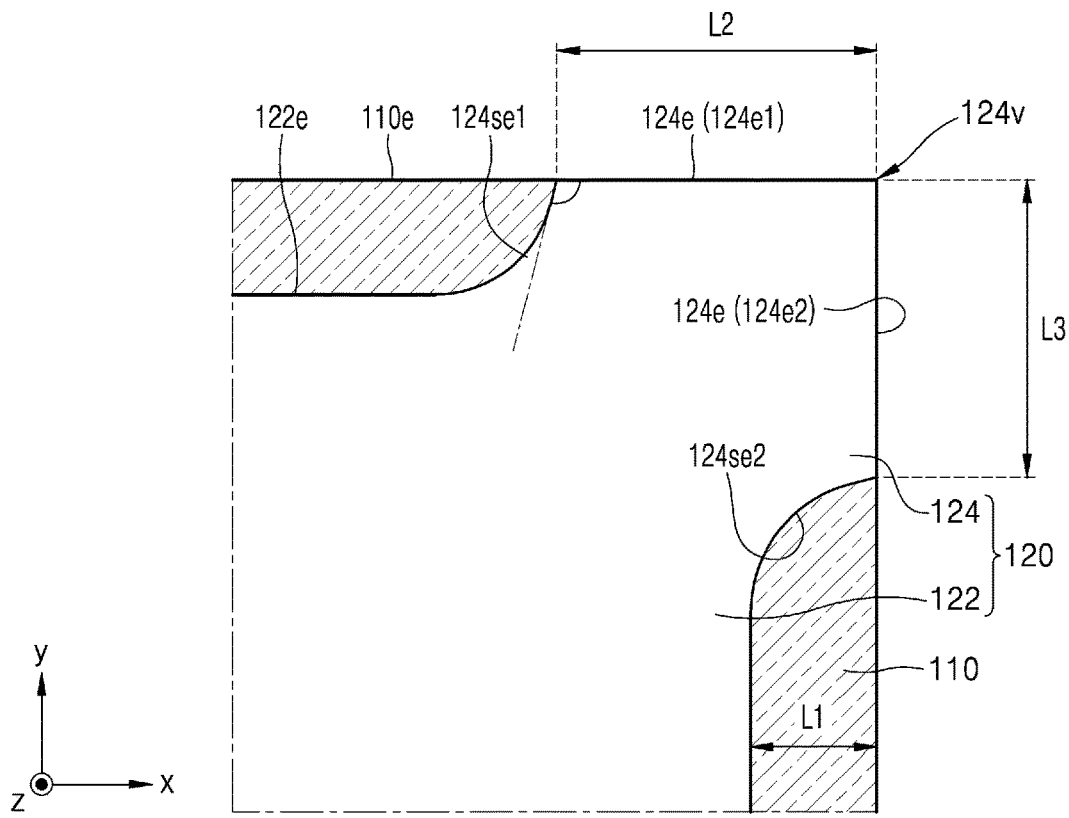

The insulating layer corner portion 124 of the embodiment of FIG. 5B is the same as the insulating layer corner portion 124 described above with reference to FIG. 4, except for the shape of the first sub-edge 124se1 and the shape of the second sub-edge 124se2. Thus, descriptions below will be focused on this difference and a repeated description of similar or identical elements may be omitted for convenience of explanation.

Referring to the embodiment of FIG. 5B, the first edge 124e1 of the insulating layer corner portion 124 may have the second size L2 in the X direction, and the second edge 124e2 of the insulating layer corner portion 124 may have the third size L3 in die Y direction. The first sub-edge 124se1 may be adjacent and connected to the first edge 124e1, and the second sub-edge 124se2 may be adjacent and connected to the second edge 124e2.

Each of the first sub-edge 124se1 and the second sub-edge 124se2 may form a concave curve. In the embodiment of FIG. 5B, the first sub-edge 124se1 may be positioned at an obtuse angle with respect to the first edge 124e1, and the second sub-edge 124se2 may be positioned at an obtuse angle with respect to the second edge 124e2. In an embodiment, the obtuse angle may be in a range of about 90 degrees to about 140 degrees.

Figure 5C:
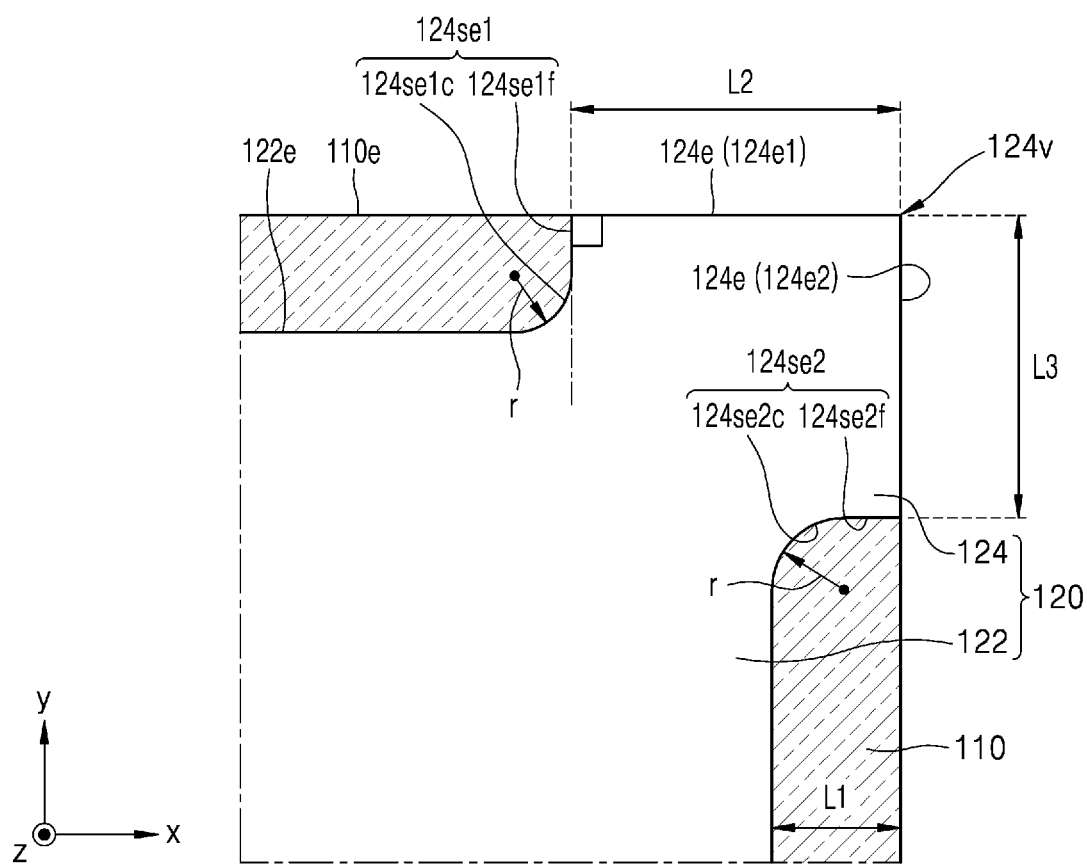

The insulating layer corner portion 124 of the embodiment of FIG. 5C is the same as the insulating layer corner portion 124 described above with reference to FIG. 4, except for the shape of the first sub-edge 124se1 and the shape of the second sub-edge 124se2. Thus, descriptions below will be focused on this difference and a repeated description of similar or identical elements may be omitted for convenience of explanation.

Referring to the embodiment of FIG. 5C, the first edge 124e1 may have the second size L2 in the X direction, and the second edge 124e2 may have the third size L3 in the Y direction. The first sub-edge 124se1 may be adjacent and connected to the first edge 124e1, and the second sub-edge 124se2 may be adjacent and connected to the second edge 124e2.

Each of the first sub-edge 124se1 and the second sub edge 124se2 may not entirely be a curve and may include a curved portion 124se1c or 124se2c. For example, in an embodiment, a straight line portion 124se1f of the first sub-edge 124se1 is positioned closest to the first edge 124e1 and may extend in the Y direction. A straight line portion 124se2f of the second sub-edge 124se2 is positioned closest to the second edge 124e2 and may extend in the X direction. The curved portion 124se1c or 124se2c of each of the first sub-edge 124se1 and the second sub-edge 124se2 may include a quadrant, which is an arc having a size "r" as the radius of curvature, wherein the size "r" is less than the first size L1.

The curved portion 124se1c of the first sub-edge 124se1 may correspond to a quadrant and may be connected to the straight line portion 124se1f, and the straight line portion 124se1f may be connected to the first edge 124e1. As shown in the embodiment of FIG. 5C, the straight line portion 124se1f may be connected to the first edge 124e1 at a right angle. However, embodiments of the present inventive concepts are not limited thereto.

Similarly to the first sub-edge 124se1, the curved portion 124se2c of the second sub-edge 124se2 may correspond to a quadrant sand may be connected to the straight line portion 124se2f, and the straight line portion 124se2f may be connected to the second edge 124se2. As shown in the embodiment of FIG. 5C, the straight line portion 124se2f may be connected to the second edge 124e2 at a right angle. However, embodiments of the present inventive concepts are not limited thereto.

Figure 5D:
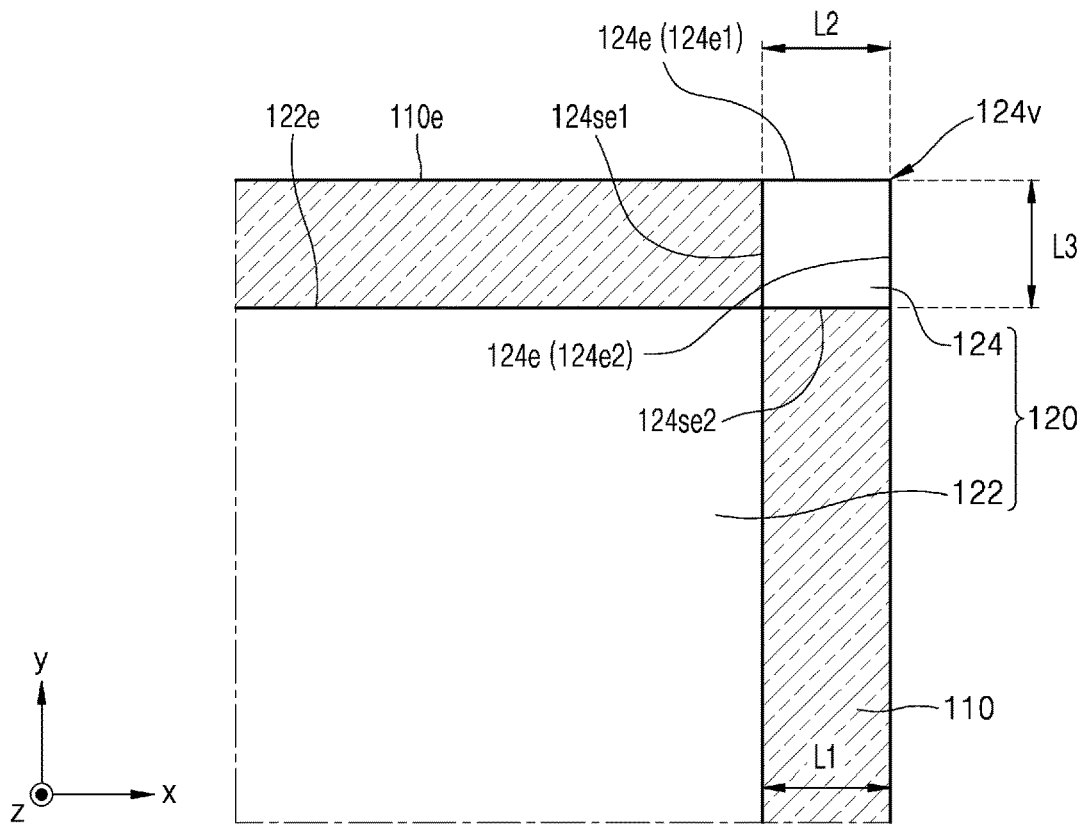

The insulating layer corner portion 124 of the embodiment of FIG. 5D is the same as the insulating layer corner portion 124 described above with reference to FIG. 4, except for the size of the first edge 124e1 and the size of the second edge 124e2. Thus, descriptions below will be focused on this difference and a repeated description of similar or identical elements may be omitted for convenience of explanation.

Referring to the embodiment of FIG. 5D, the size of the first edge 124e1 in the X direction may be the second size L2 which is substantially the same as a width, by which an edge of the insulating layer central portion 122 retreats from (e.g., is spaced apart from an edge of the semiconductor substrate 110 in the X direction. In some embodiments, the size of the second edge 124e2 in the Y direction may be the third size L3 which is substantially the same as a width, by which an edge of the insulating layer central portion 122 retreats from (e.g., is spaced apart from) an edge of the semiconductor substrate 110 in the Y direction.

In some embodiments, the second size L2 of the first edge 124e1 in the X direction may be substantially the same as the first size L1. The third size L3 of the second edge 124e2 in the Y direction may be substantially the same as the first size L1.

Referring back to the embodiments of FIGS. 1 through 4, the wiring layer 123 may be disposed inside the insulating layer central portion 122. Although it is illustrated in FIGS. 3A and 3C that two wiring layers 123 are formed in the insulating layer central portion 122, embodiments of the present inventive concepts are not limited thereto. For example, in an embodiment, there may be a single wiring layer 123 or at least three wiring layers 123.

In an embodiment, the insulating layer corner portion 124 may not include a wiring layer therein.

A wiring layer 123 may be electrically connected to a connection pad 140. A connector 150 may be provided on the connection pad 140. The wiring layer 123 may be electrically connected to the connector 150 through the connection pad 140.

The connection pad 140 may be exposed by the passivation layer 130, which is described below. In an embodiment, the connection pad 140 may include a metal, such as copper (Cu), nickel (Ni) palladium (Pd), gold (Au), platinum (Pt), silver (Ag), tin (Sn), indium (In), bismuth (Bi), antimony (Sb), zinc (Zn), or tungsten (W), an alloy thereof, or a stack thereof.

The passivation layer 130 may be disposed on the insulating layer 120 (e.g., directly thereon in the Z direction). The passivation layer 130 may cover at least a portion of the insulating layer 120. In some embodiments, the passivation layer 130 may entirely cover an exposed top surface of the insulating layer 120. In this embodiment, a side surface of the passivation layer 130 may be aligned with a side surface of the insulating layer 120.

In some embodiments, the passivation layer 130 may include at least two layers. In some embodiments, the passivation layer 130 may include photosensitive polyimide (PSPI). In some embodiments, the passivation layer 130 may timber include an insulator layer such as a silicon nitride layer or a silicon oxide layer. In some embodiments, the passivation layer 130 may include a different material than the insulating layer 120.

The connector 150 may be disposed on the connection pad 140 (e.g., directly thereon in the Z direction). In an embodiment, the connector 150 may include a conductive material, such as Cu, aluminum (Al), Ag, Au, or solder. However, the material of the connector 150 is not limited thereto. The connector 150 may include multiple layers or single layer. For example, in an embodiment in which the connector 150 includes multiple layers, the connector 150 may include a copper pillar and solder. In an embodiment in which the connector 150 includes a single layer, the connector 150 may include tin-silver solder or copper.

Figure 6:
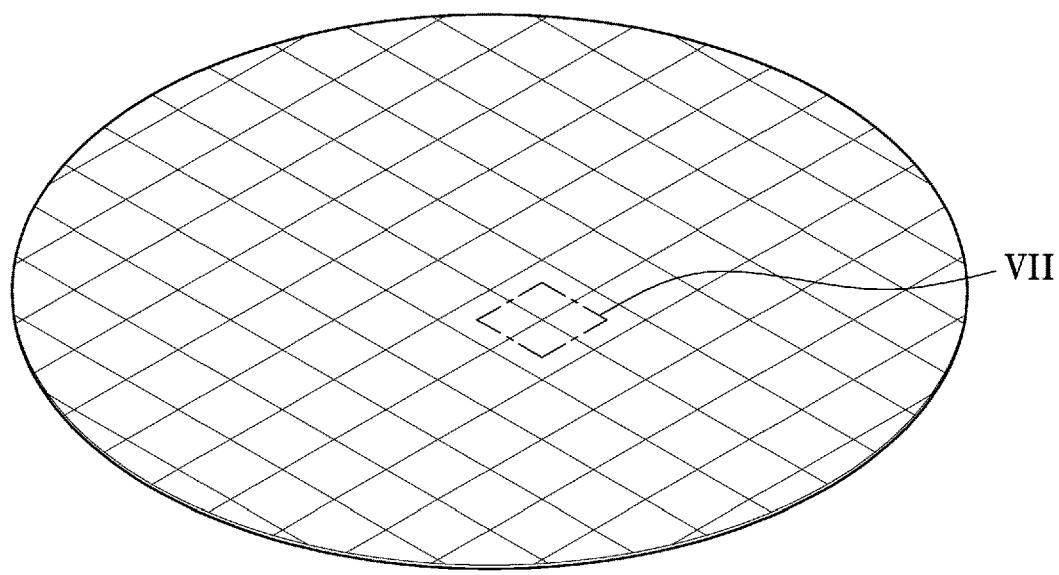
FIG. 6 is a perspective view of a wafer used to manufacture a semiconductor device, according to an embodiment of the present inventive concepts.

FIG. 6 is a perspective view of a wafer 1 used to manufacture a semiconductor device, according to an embodiment.

The wafer 1 of FIG. 6 may have undergone a semiconductor process for forming electronic devices, a metallization process for forming a metal wire connecting the electronic devices to each other and an interlayer insulating film, and a passivation process for forming a protection layer protecting the electronic devices.

As shown in the embodiment of FIG. 6, regions to be separated into semiconductor dies are partitioned by scribe lanes.

Figure 7A:
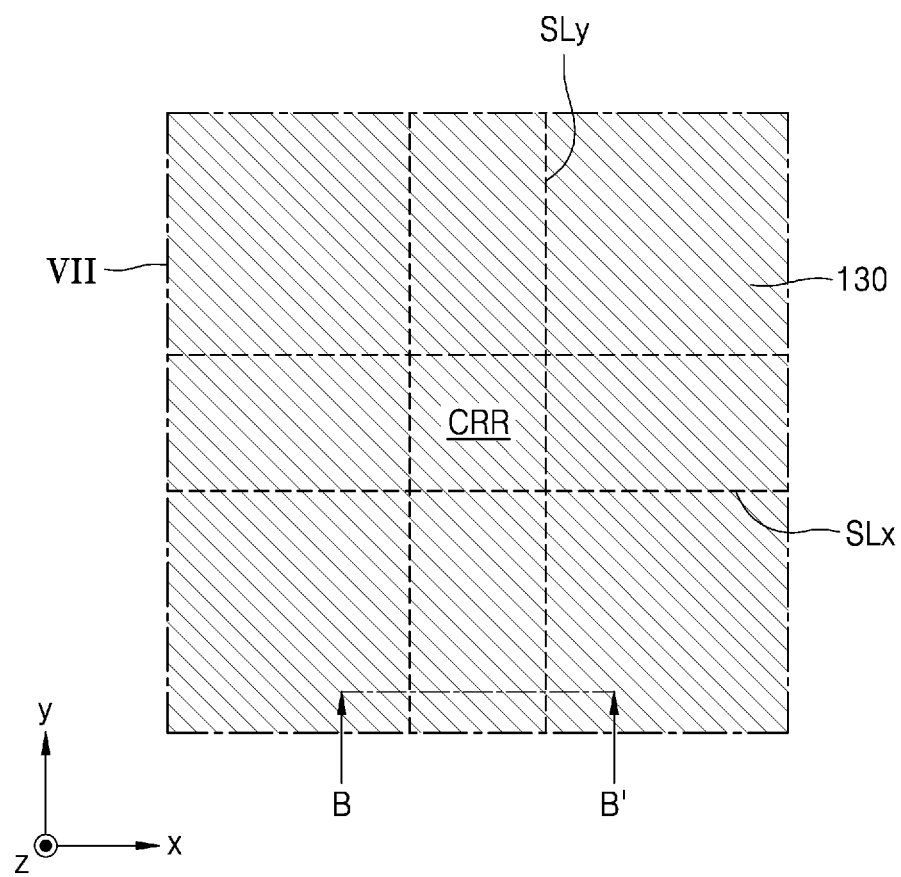
FIG. 7A is a plan view of a region VII in FIG. 6 according to an embodiment of the present inventive concepts.
Figure 7B:
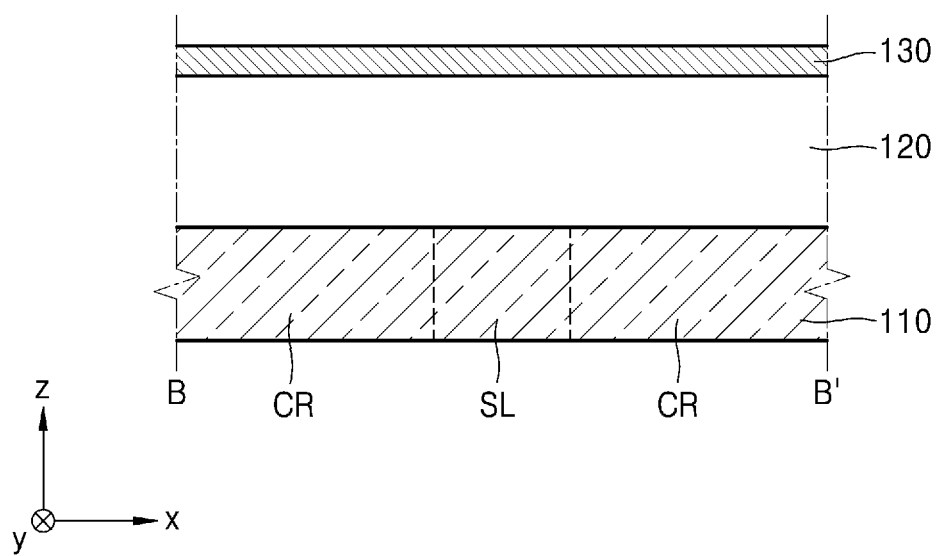
FIG. 7B illustrates a cross-section taken along line B-B' in FIG. 7A according to an embodiment of the present inventive concepts.

FIG. 7A is a plan view of a region VII of FIG. 6, and FIG. 7B illustrates a cross-section taken along line B-B' in FIG. 7A.

Referring to FIGS. 7A and 7B, chip regions CR may be separated from each other by a scribe lane SL. The scribe lane SL may include a first scribe lane SLx, which extends in the X direction, and a second scribe lane SLy, which extends in the Y direction. The first scribe lane SLx may intersect with the second scribe lane SLy at a cross region CRR.

As shown in the embodiment of FIG. 7B, the semiconductor substrate 110, the insulating layer 120, and the passivation layer 130 are sequentially stacked (e.g., in the Z direction). The detailed configurations thereof have been described above with reference to FIGS. 1 through 3C, and thus detailed descriptions of similar or identical elements thereof are omitted for convenience of explanation. For convenience of illustration, a semiconductor device formed on an active surface of the semiconductor substrate 110, wiring layers inside the insulating layer 120, and a connection pad exposed by the passivation layer 130 are omitted.

Figure 8A:
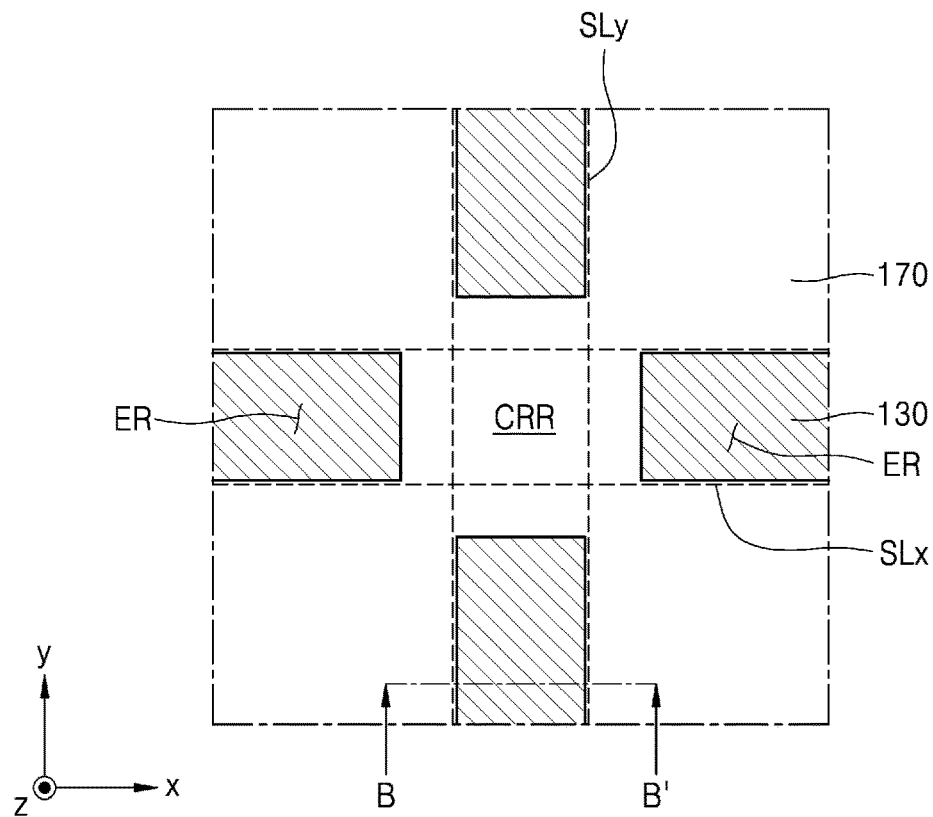
FIGS. 8A and 8B are diagrams of a process shire after the process stage of FIGS. 7A and 7B according to embodiments of the present inventive concepts.
Figure 8B:
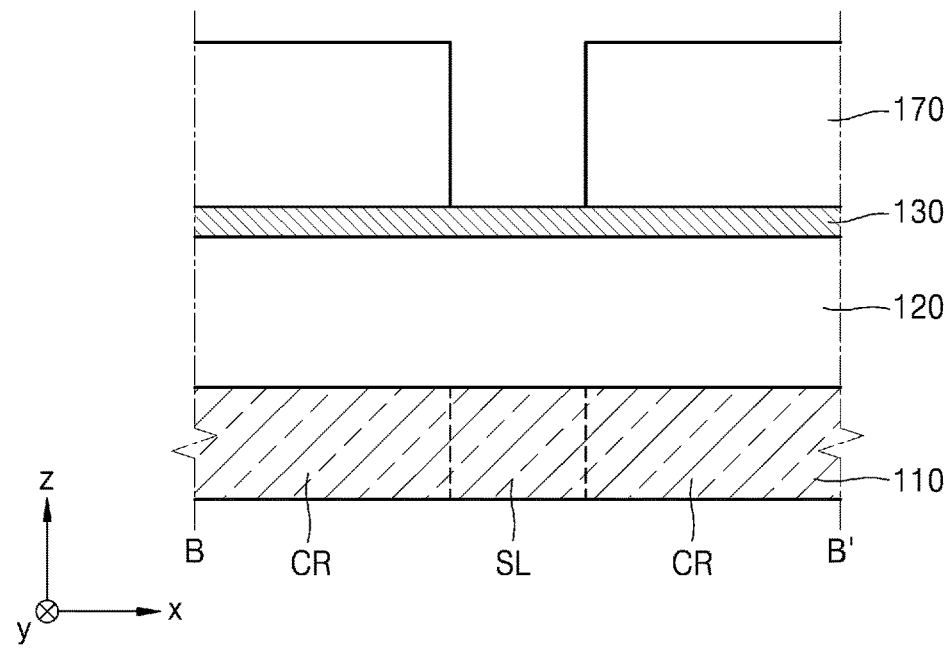

FIGS. 8A and 8B are schematic diagrams of a process stage after the process stage of FIGS. 7A and 7B.

Referring to the embodiments of FIGS. 8A and 8B, an etch mask pattern 170 is formed on the passivation layer 130 (e.g., directly thereon in the Z direction) to remove portions of the insulating layer 120 and the passivation layer 130 along the scribe lane SL.

In some embodiments, the etch mask pattern 170 may include a photoresist material. In some embodiments, the etch mask pattern 170 may include a hard mask such as a silicon nitride mask or a spin-on hardmask (SOH). However, embodiments of the present inventive concepts are not limited thereto.

The etch mask pattern 170 may expose the top surface of the passivation layer 130 in portions of the extension directions of the first and second scribe lanes SLx and SLy. However, the etch mask pattern 170 may cover the top surface of the passivation layer 130 in the cross region CRR, in which the first and second scribe lanes SLx and Sly respectively extending in different directions (e.g., the X and Y directions, respectively) intersect with each other. As shown in the embodiment of FIG. 8A, the first scribe lane SLx intersects with the second scribe lane SLy at the cross region CRR, and the etch mask pattern 170 covers the top surface of the passivation layer 130 in the cross region CRR. In a embodiment, the etch mask pattern 170 may also cover portions of the top surface of the passivation layer 130 in the extension directions of the first and second scribe lanes SLx and SLy immediately adjacent to the cross region CRR. However, embodiments of the present invention concepts are not limited thereto.

An exposure region ER, in which the etch mask pattern 170 exposes the top surface of the passivation layer 130, may extend along an edge of a chip region CR and may not extend to the cross region CRR.

Figure 9A:
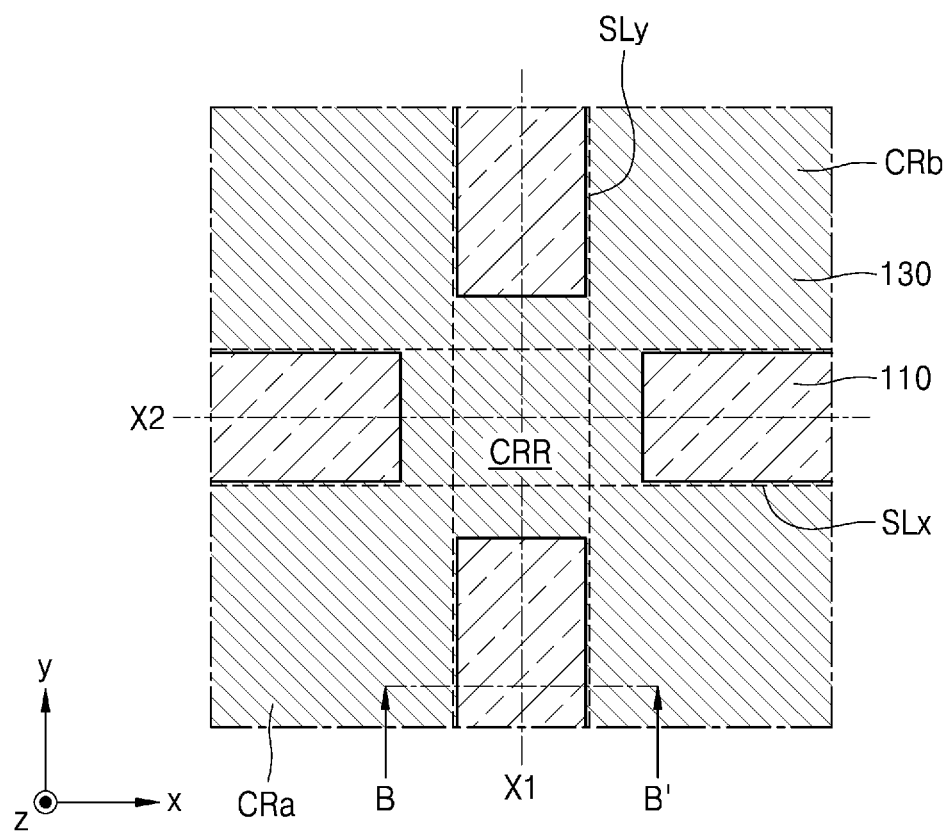
FIGS. 9A and 9B are diagrams of a process stage after the process stage of FIGS. 8A and 8B according to embodiments of the present inventive concepts.
Figure 9B:
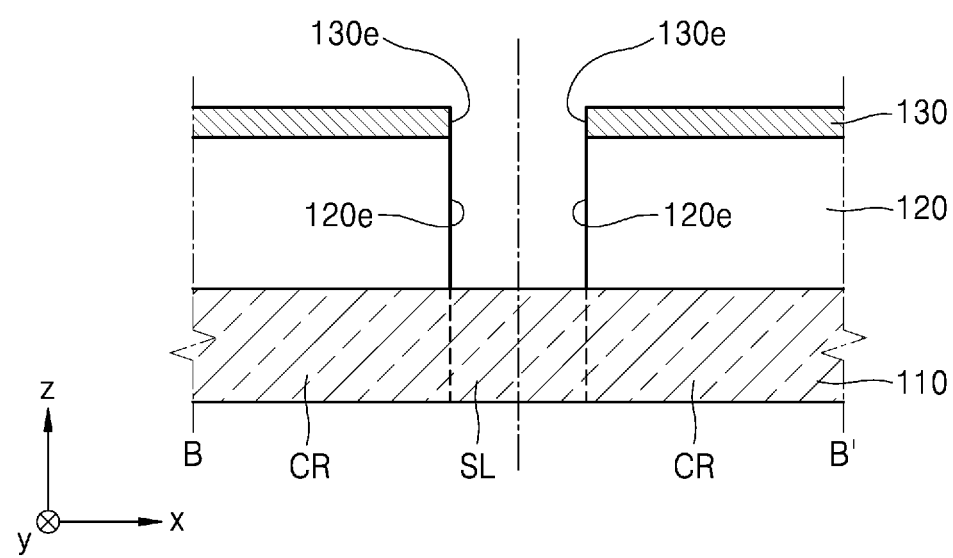

FIGS. 9A and 9B are schematic diagrams of a process stage after the process stage of FIGS. 8A and 8B.

Referring to the embodiments of FIGS. 9A and 9B, the passivation layer 130 and the insulating layer 120, which are exposed by the etch mask pattern 170, are removed by anisotropic etching. Thereafter, the etch mask pattern 170 is removed. As shown in the embodiment of FIG. 9B, when the passivation layer 130 and the insulating layer 120 are removed by anisotropic etching, an edge 130e of the passivation layer 130 may be aligned with an edge 120e of the insulating layer 120.

Although it is illustrated in the embodiment of FIG. 9B that an etched side wall is at a right angle with respect to the top surface of the semiconductor substrate 110, embodiments of the present inventive concepts are not limited thereto. For example, in an embodiment, the etched side wall may be oblique with respect to the top surface of the semiconductor substrate 110.

In the cross region CRR, the passivation layer 130 and the insulating layer 120 are not etched. Accordingly, as shown in the embodiment of FIG. 9A, an insulating layer and a passivation layer in a first chip region CRa are respectively continuously connected to an insulating layer and a passivation layer in a second chip region CRb that is diagonally opposite (e.g., in a horizontal direction between the X and Y directions) the first chip region CRa.

In a comparative embodiment in which the etch mask pattern 170 exposes the passivation layer 130 and the insulating layer 120 even in the cross region CRR, the passivation layer 130 and the insulating layer 120 in the cross region CRR will also be removed by the etching. As a result, the insulating layer and the passivation layer in the first chip region CRa are respectively separated from the insulating layer and the passivation layer in the second chip region CRb that is diagonally opposite the first chip region CRa.

In this comparative embodiment, when shear stress is applied to the back of the semiconductor substrate 110 to thin the semiconductor substrate 110, the first chip region CRa may be deformed by the shear stress such that a vertex a the first chip region CRa bumps into a vertex of the second chip region CRb, and according, a crack or a particle may occur. As a result, a semiconductor device having high reliability and a low failure rate may not be obtained.

In contrast, in the embodiment shown in FIG. 9A, because the insulating layer and the passivation layer in the first chip region CRa are respectively continuously connected to the insulating layer and the passivation layer in the second chip region CRb that is diagonally opposite the first chip region CRa, the first chip region CRa does not bump into another chip region diagonally adjacent thereto even when shear stress is applied to the semiconductor substrate 110, and accordingly, failures caused by a crack or a particle may be reduced.

Figure 10A:
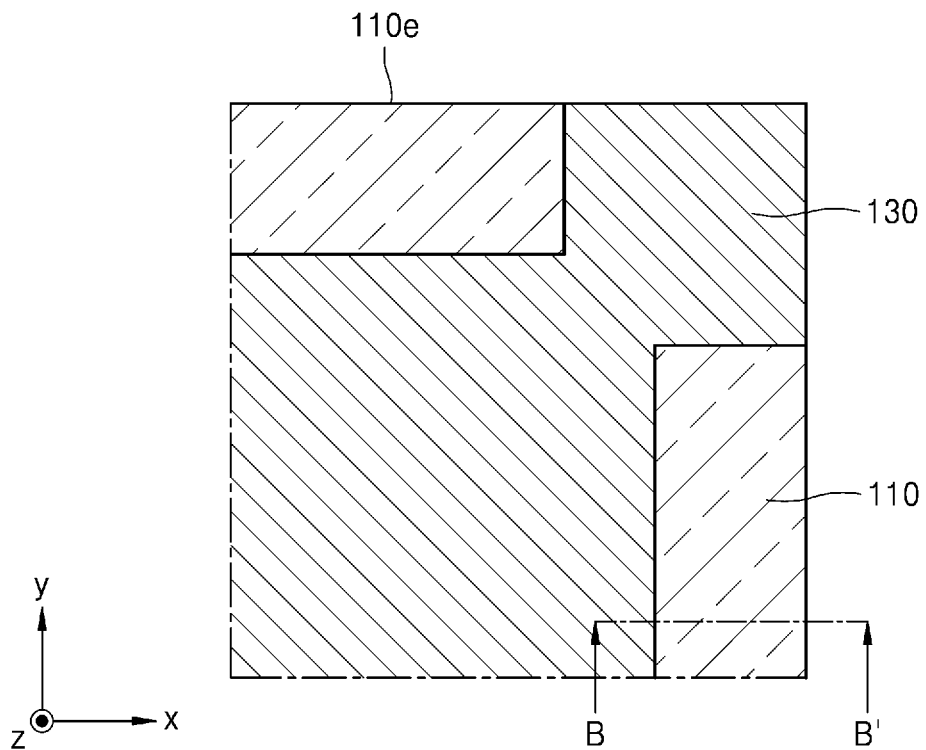
FIG. 10A illustrates one of separated chip regions according to an embodiment of the present inventive concepts.

When tensile stress is applied to the semiconductor substrate 110 in the horizontal direction in an additional process thereafter, chip regions may be separated from each other along a first axis X1 and a second axis X2 as shown in FIG. 9A. FIG. 10A illustrates one of the separated chip regions described above, such as the first chip region CRa, and FIG. 10B illustrates a cross-section taken along line B-B' in FIG. 10A.

Figure 10B:
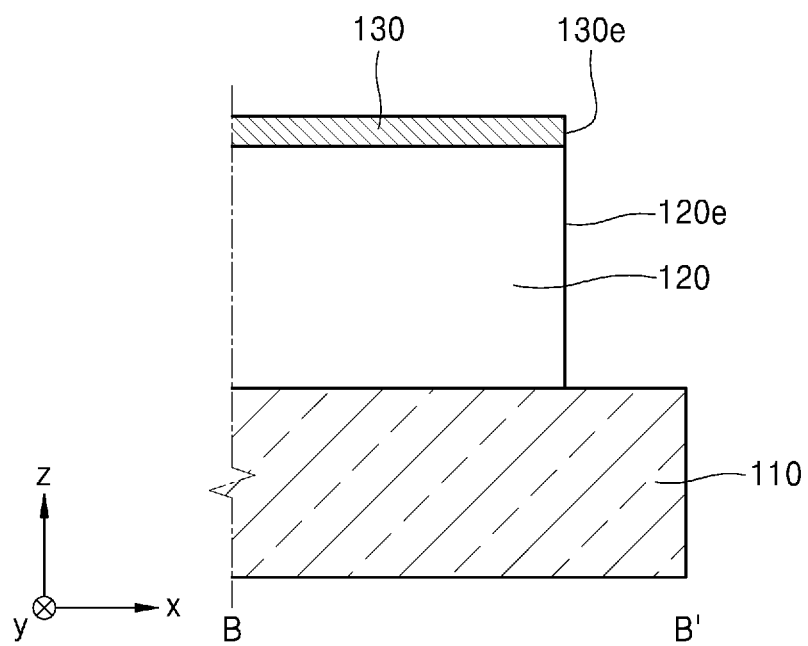
FIG. 10B illustrates a cross-section taken along line B-B' in FIG. 10A according to an embodiment of the present inventive concepts.

Referring to the embodiments of FIGS. 10A and 10B, the edge 120e of the insulating layer 120 extends along the edge 110e of the semiconductor substrate 110. The insulating layer 120 has a protrusion, which protrudes in the lateral direction (e.g., in a horizontal direction), in a corner of the semiconductor substrate 110 forming the insulating layer corner portion 124. The passivation layer 130 may entirely cover the top surface of the insulating layer 120, and the edge 130e of the passivation layer 130 may be aligned with the edge 120e of the insulating layer 120. For example, the passivation layer may cover an entirety of the insulating layer central portion 122 and the insulating layer corner portion 124.

The edge 120e of the insulating layer 120, which extends in the Y direction, may retreat from (e.g., be spaced apart from) the edge 110e of the semiconductor substrate 110, which extends in the Y direction, by a certain distance in the X direction. The edge 120e of the insulating layer 120, which extends in the X direction, may retreat from (e.g., be spaced apart from) the edge 110e of the semiconductor substrate 110, which extends in the X direction, by a certain distance in the Y direction. The edge 120e of the insulating layer 120 may be aligned with the edge 110e of the semiconductor substrate 110 in the corner of the semiconductor substrate 110.

Figure 11:
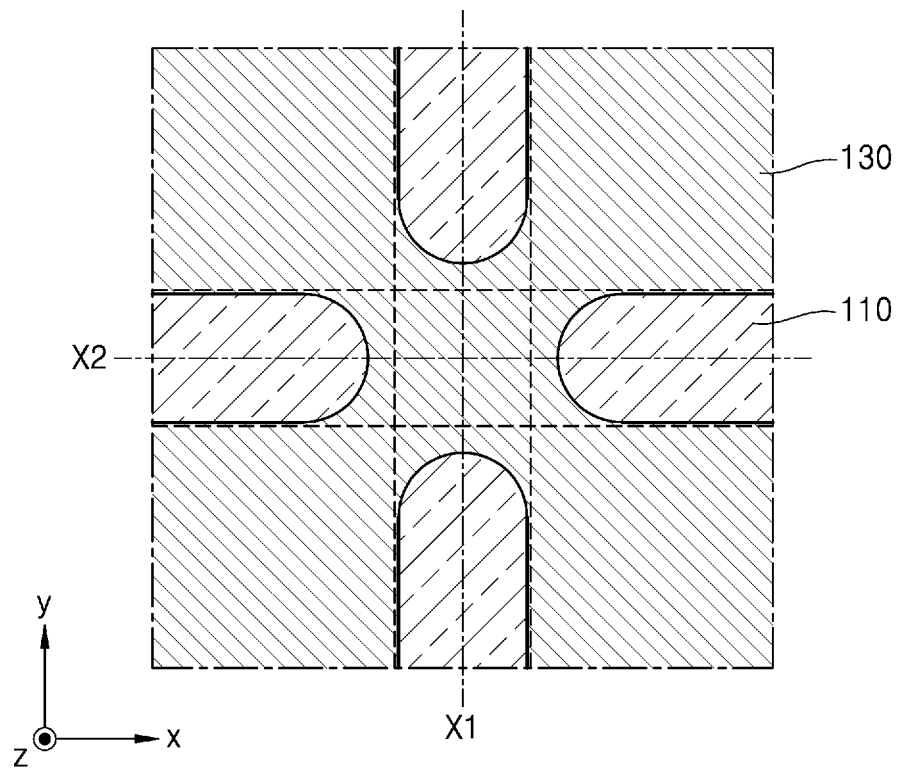
FIGS. 11 through 13 are diagrams of various embodiments, in which a pattern is formed in a scribe lane according to embodiments of the present inventive concepts.
Figure 12:
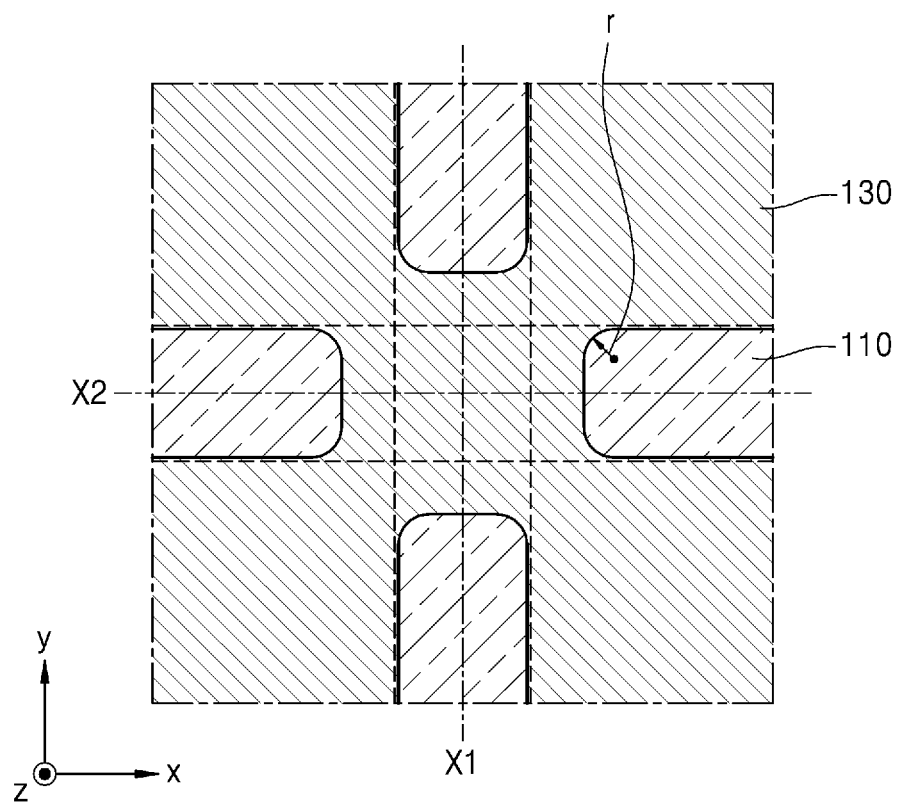
Figure 13:
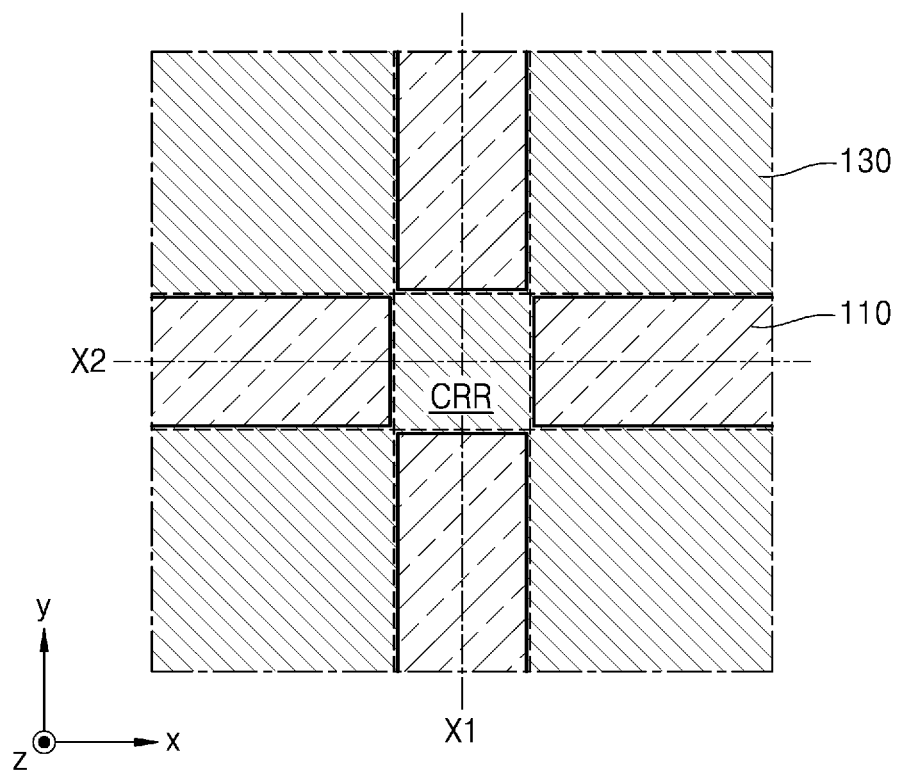

FIGS. 11 through 13 are schematic diagrams of various embodiments, in which a pattern is formed in a scribe lane.

Referring to the embodiment of FIG. 11, an end portion of a recess pattern formed in a scribe lane has a semicircular shape. This recess pattern may be obtained by forming the etch mask pattern 170 (see FIGS. 8A and 8B) to have a semicircular end portion and performing etching.

When chip regions are separated from each other along the first axis X1 and the second axis X2 by applying tensile stress to the semiconductor substrate 110 in the horizontal direction (e.g., in the X direction and/or the Y direction), the insulating layer corner portion 124 shown in the embodiment of FIG. 5A may be obtained in which the first sub-edge 124se1 and the second sub-edge 124se2 may form a concave curve and the first sub-edge 124se1 may be positioned at a right angle with respect to the first edge 124e1. When sawing is performed along the scribe lane instead of applying tensile stress to the semiconductor substrate 110 in the horizontal direction, the insulating layer corner portion 124 in the embodiment of FIG. 5B may be obtained in which the first sub-edge 124se1 and the second sub edge 124se2 may form a concave curve and the first sub-edge 124se1 may be positioned at an obtuse angle with respect to the first edge 124e1.

Referring to the embodiment of FIG. 12, an end portion of a recess pattern formed in a scribe lane may include a quadrant arc having the radius "r". This recess pattern may be obtained by forming the etch mask pattern 170 (see FIGS. 8A and 8B) to have a quadrant arc in an end portion thereof and performing etching.

When chip regions are separated from each other along the first axis X1 and the second axis X2 by applying tensile stress to the semiconductor substrate 110 in the horizontal direction (e.g, in the X direction and/or the Y direction), the insulating layer corner portion 124 in the embodiment of FIG. 5C may be obtained in which, the straight line portion 124se1f of the first sub-edge 124se1 may be connected to the first edge 124e1 at a right angle and the straight line portion 124se2f of the second sub-edge 124se2 may be connected to the second edge 124e2 at a right angle.

Referring to the embodiment of FIG. 13, a recess pattern formed in a scribe lane may cover only the cross region CRR and expose the semiconductor substrate 110 in the remaining portion of the scribe lane. This recess pattern may be obtained by forming the etch mask pattern 170 (see FIGS. 8A and 8B) to cover only the cross region. CRR and expose the semiconductor substrate 110 in the remaining portion of the scribe lane and performing etching.

When chip regions are separated from each other along the first axis X1 and the second axis X2 by applying tensile stress to the semiconductor substrate 110 in the horizontal direction in the X direction and the Y direction), the insulating layer corner portion 124 shown in the embodiment of FIG. 5D may be obtained in which the second size L2 of the first edge 124e1 in the X direction may be substantially the same as a width L1, by which an edge of the insulating layer central portion 122 retreats from (e.g., is spaced apart from) an edge of the semiconductor substrate 110 in the X direction and the third size L3 of the second edge 124e2 in the Y direction may be substantially the same as a width, by which an edge of the insulating layer central portion 122 retreats from (e.g., is spaced apart from) edge of the semiconductor substrate 110 in the Y direction.

FIGS. 14A through 14F are side views of stages in a method of separating chip regions by applying tensile stress in a horizontal direction according to embodiments of the present inventive concepts.

Figure 14A:
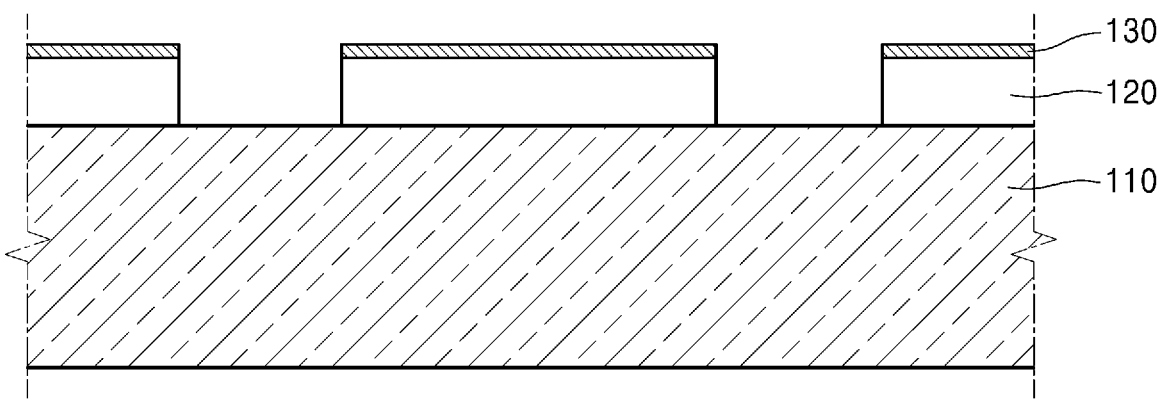
FIGS. 14A through 14F are side views of stages in a method of separating chip regions by applying tensile stress in a horizontal direction according to embodiments of the present inventive concepts.

Referring to the embodiment of FIG. 14A, a pattern is formed in the insulating layer 120 and the passivation layer 130 using the etch mask pattern 170, as described above with reference to the embodiments of FIGS. 9A, 9B, and 11 through 13. Since the semiconductor substrate 110, the insulating layer 120, and the passivation layer 130 have been described above with reference to FIGS. 1 through 3C, detailed descriptions thereof of similar or identical elements will be omitted below for convenience of explanation.

In FIG. 14A, a region, in which the insulating layer 120 and the passivation layer 130 are disposed, corresponds to a chip region, and a region, in which a trench is formed by removing the insulating layer 120 and the passivation layer 130, corresponds to a scribe lane region. The width of the scribe lane region is somewhat exaggerated for clarity.

Figure 14B:
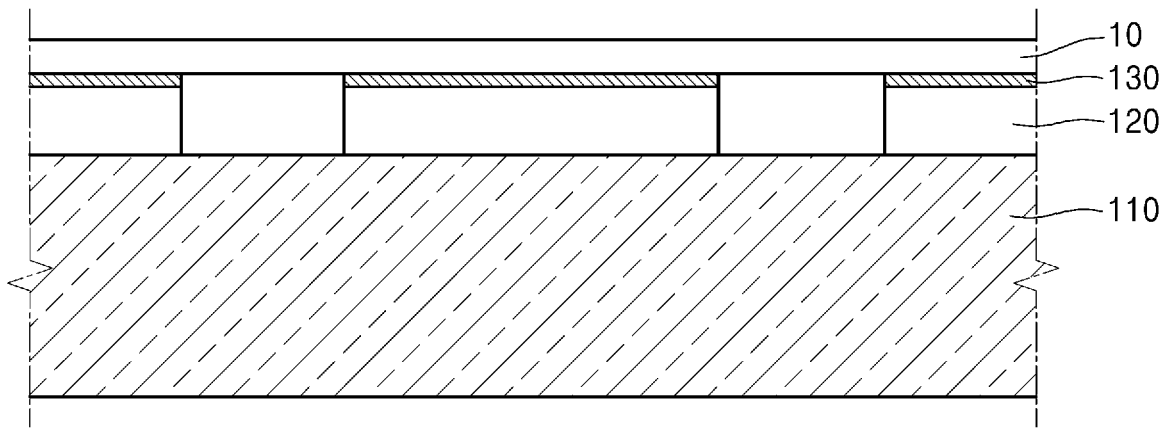

Referring to the embodiment of FIG. 14B, a lamination tape 10 is attached to the passivation layer 130 (e.g., directly on an upper surface thereof). The lamination tape 10 allows each chip region to maintain a position thereof during radiation of a laser beam or a thinning process, which is performed afterward. In addition, the lamination tape 10 may be configured to have an adhesive strength that is reduced by being irradiated with light having a certain wavelength.

Figure 14C:
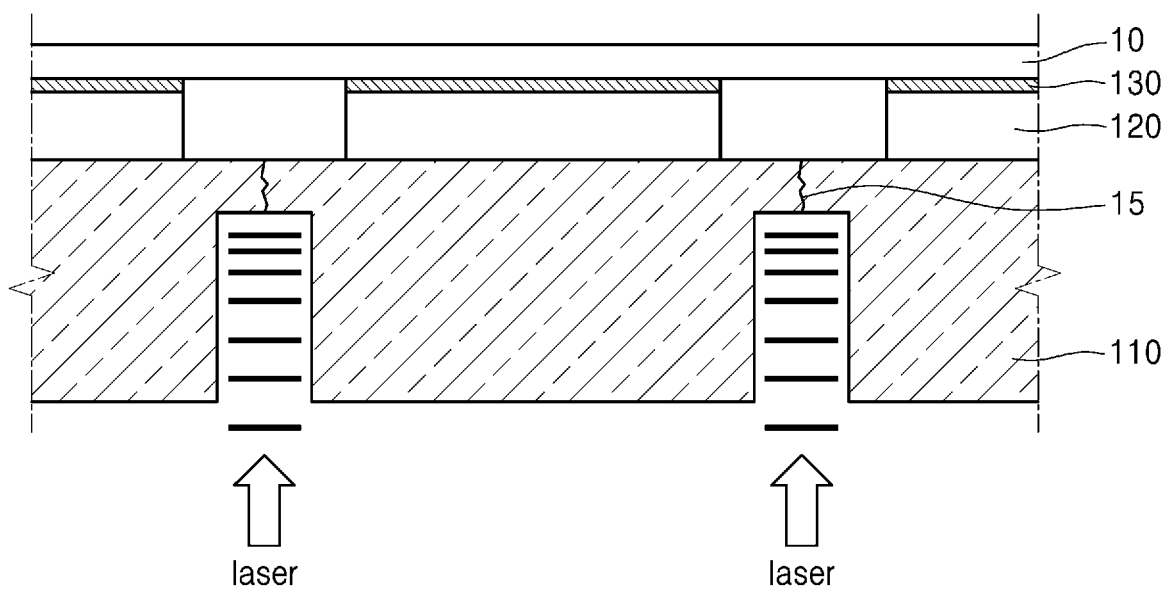

Referring to the embodiment of FIG. 14C, a trench is formed by radiating a laser beam to the back of the semiconductor substrate 110 (e.g., a lower surface of the semiconductor substrate 110 in the thickness direction) along the scribe lane. In an embodiment, a crack 15 may occur along the scribe lane due to the radiation of the laser beam.

Figure 14D:
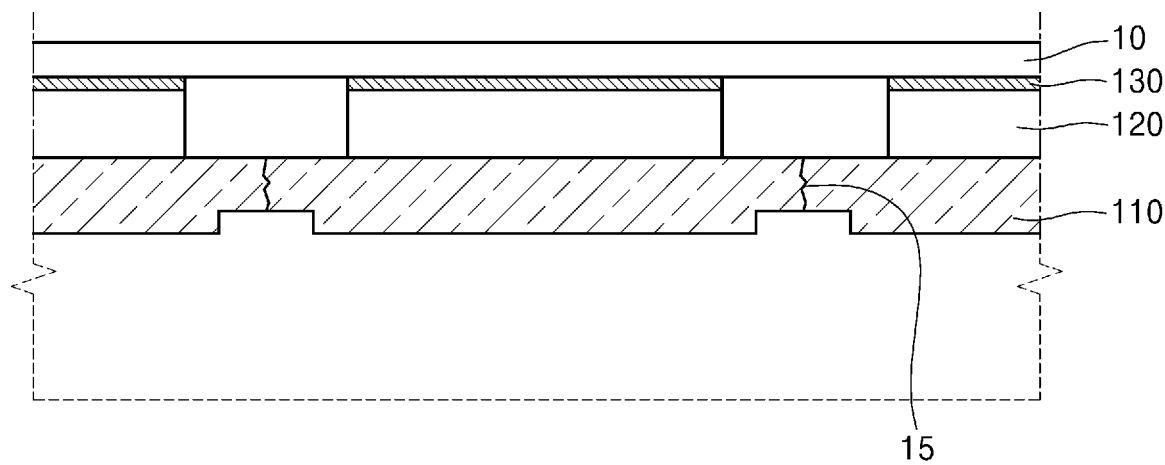

Referring to the embodiment of FIG. 14D, the semiconductor substrate 110 may be made to have a certain thickness by thinning the back of the semiconductor substrate 110. In an embodiment, the thinning may be formed by grinding the back of the semiconductor substrate 110. However, embodiments of the present inventive concepts are not limited thereto.

Figure 14E:
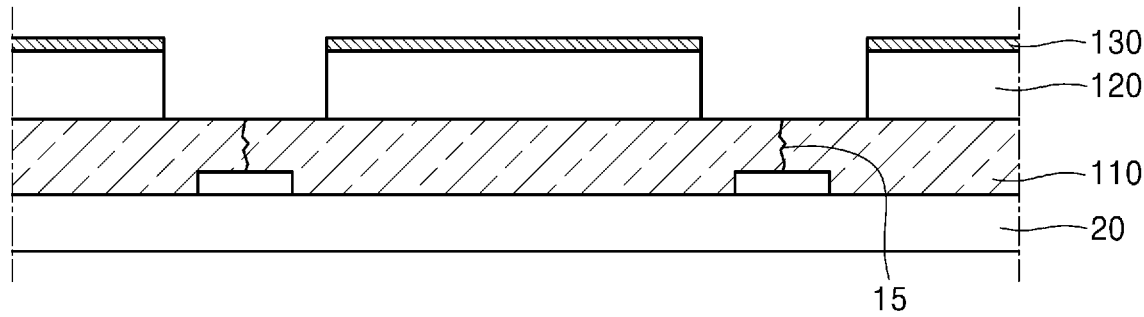

Referring to the embodiment of FIG. 14E, a die attach film (DAF) 20 may be attached to the thinned back of the semiconductor substrate 110. Thereafter, the adhesive strength between the lamination tape 10 and the passivation layer 130 may be reduced by radiating ultraviolet (UV) light to the lamination tape 10, and then the semiconductor substrate 110 may be removed.

Figure 14F:
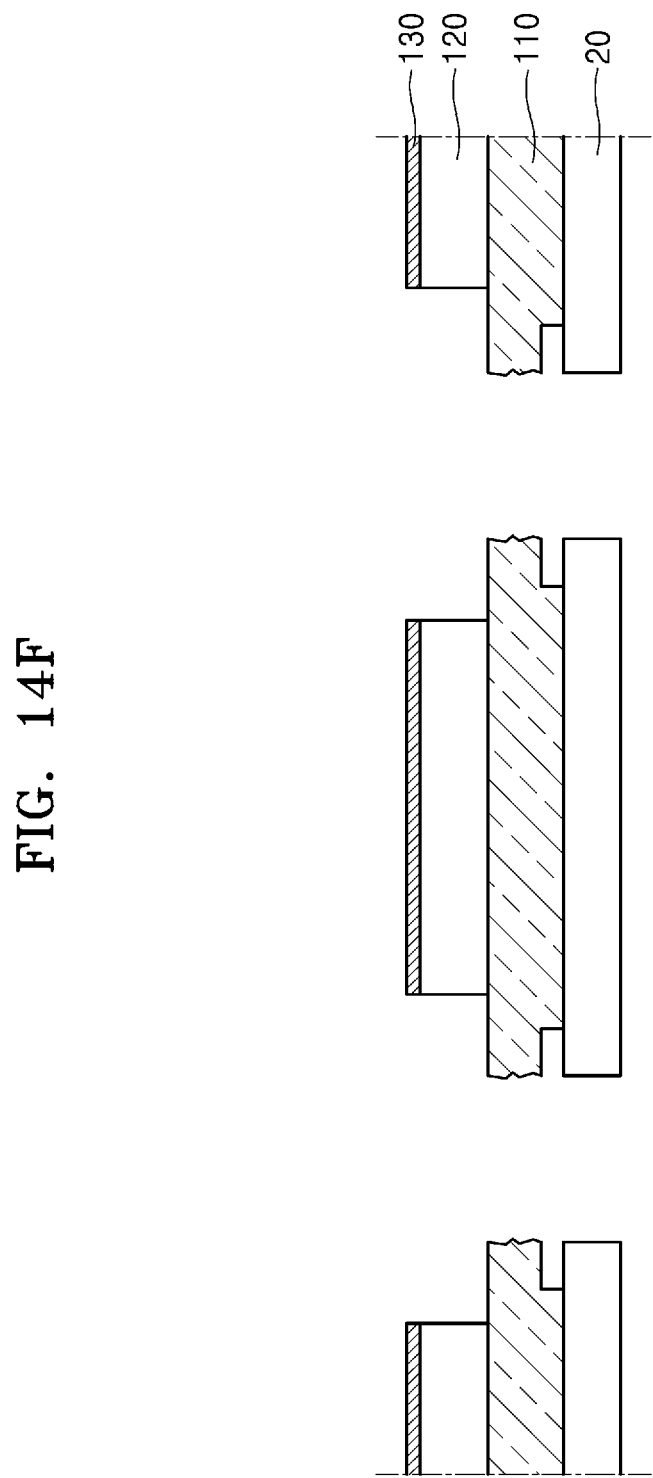

Referring to the embodiment of FIG. 14F, chip regions may be separated from each other by cooling the semiconductor substrate 110 having the DAF 20 attached thereto and applying tensile stress to the semiconductor substrate 110 in the lateral direction.

According to the pattern shapes shown in the embodiments of FIGS. 9A through 13, the insulating layer corner portion 124 of the insulating layer 120 shown in the embodiments of FIGS. 4 through 5D may be obtained by separating the chip regions from each other.

Accordingly, a semiconductor device and a semiconductor package, which have high reliability and a low failure rate, may be obtained.

Figure 15:
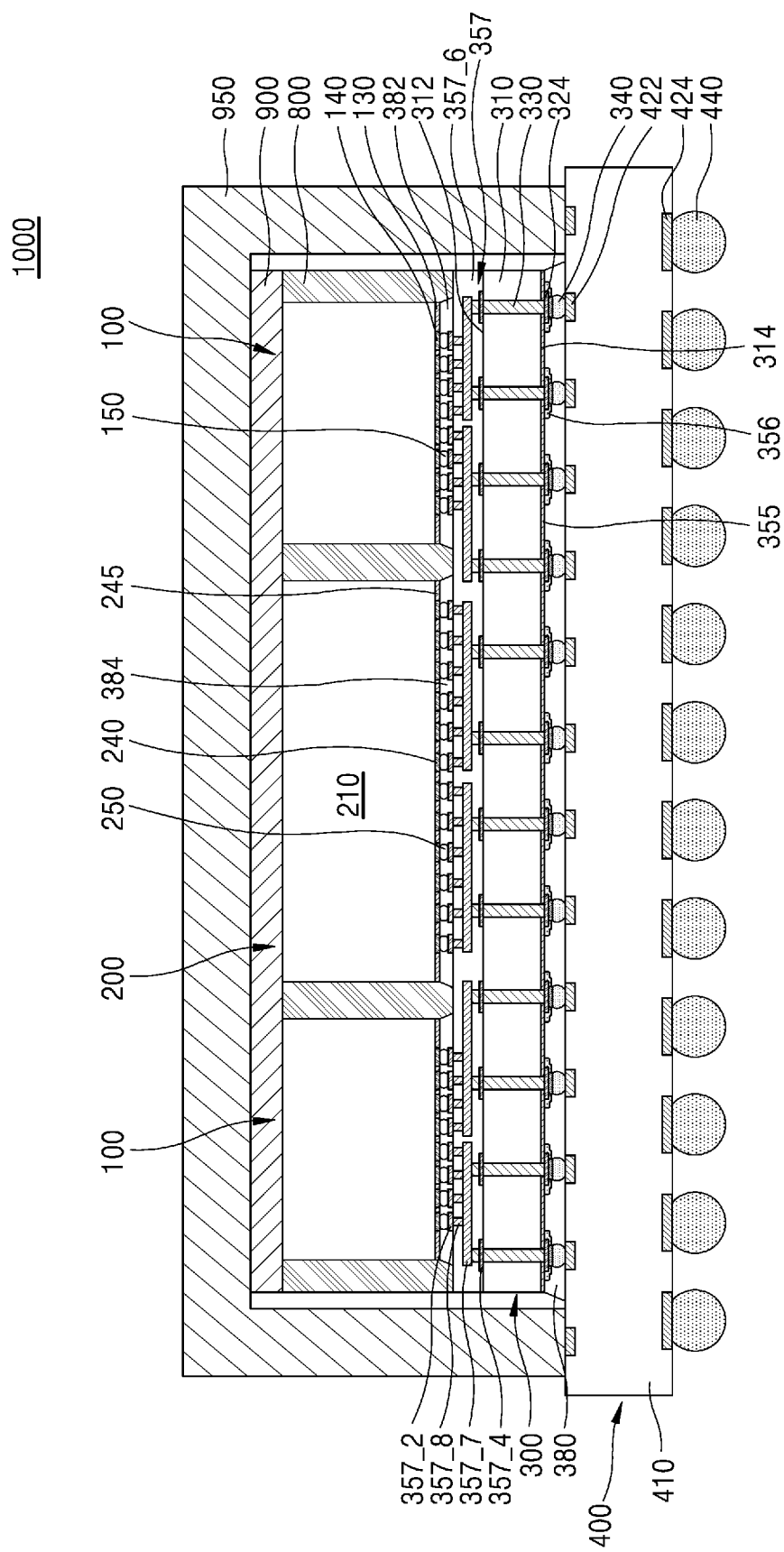
FIG. 15 is a cross-sectional view of a semiconductor package according to an embodiment of the present inventive concepts.

FIG. 15 is a cross-sectional view of a semiconductor package 1000 according to an embodiment.

Referring to the embodiment of FIG. 15, the semiconductor package 1000 may include a second substrate 400, a first substrate 300 mounted on the second substrate 400, and a first semiconductor device 100 and a second semiconductor device 200, which are mounted on the first substrate 300. In an embodiment, the first semiconductor device 100 and the second semiconductor device 200 may be mounted on a redistribution structure 357 of the first substrate 300 to be adjacent to each other in the horizontal direction (e.g., an X and/or Y direction). At this time, the first semiconductor device 100 is separated from (e.g., spaced apart from) the second semiconductor device 200 in the horizontal direction.

The first semiconductor device 100 may be electrically connected to the first substrate 300 by a plurality of first connectors 150, and the second semiconductor device 200 may be electrically connected to the first substrate 300 by a plurality of second connectors 250. The first semiconductor device 100 may include a plurality of connection pads 140, and the second semiconductor device 200 may include a plurality of connection pads 240. The first substrate 300 may include a plurality of first redistribution pads 357_2. The first connectors 150 may be disposed between the connection pads 140 and some of the first redistribution pads 357_2. The second connectors 250 may be between the connection pads 240 and some of the first redistribution pads 357_2.

A first passivation layer 130 may be disposed on the active surface of the first semiconductor device 100, and the connection pads 140 may be exposed by the first passivation layer 130.

In some embodiments, the first semiconductor device 100 may include, for example, a DRAM chip, an SRAM chip, a flash memory chip, an EEPROM chip, a PRAM chip, a MRAM chip, or an RRAM chip. In some embodiments, the first semiconductor device 100 may include a CPU chip, a GPU chip, or an AP chip. In some embodiments, the first semiconductor device 100 may correspond to the semiconductor device 100 described with reference to the embodiments of FIGS. 1 through 5D. However, embodiments of the present inventive concepts are not limited thereto.

In some embodiments, the first semiconductor device 100 may include an HBM DRAM semiconductor chip. In some embodiments, the first semiconductor device 100 may include a buffer chip including a serial-parallel conversion circuit. In some embodiments, the first semiconductor device 100 may include a buffer chip for controlling an HBM DRAM semiconductor chip. In an embodiment in which the first semiconductor device 100 includes a buffer chip for controlling an HBM DRAM semiconductor chip, the first semiconductor device 100 may be called a master chip and the HBM DRAM semiconductor chip may be called a slave chip.

The second semiconductor device 200 may include a second semiconductor substrate 210, the connection pads 240, a second protective insulating layer 245, and the second connectors 250. The second connectors 250 may be provided on the connection pads 240. The second semiconductor substrate 210, the connection pads 240, the second protective insulating layer 245, and the second connectors 250 are substantially similar to the first semiconductor substrate 110, the connection pads 140, the first passivation layer 130, and the first connectors 150, respectively, and thus detailed descriptions thereof will be omitted for convenience of explanation.

For example in some embodiments, the second semiconductor device 200 may include a CPU chip, a GPU chip, or an AP chip.

The first substrate 300 may include a base layer 310, the redistribution structure 357 disposed on a first surface 312 of the base layer 310 (e.g., an upper surface of the base layer 310), and a plurality of pad wiring layers 324 disposed on a second surface 314 of the base layer 310 (e.g., a lower surface of the base layer 310). The redistribution structure 357 may include a redistribution dielectric layer 357_6, the first redistribution pads 357_2 disposed on a surface of the redistribution dielectric layer 357_6 (e.g., an upper surface of the redistribution dielectric layer 357_6), and a plurality of second redistribution pads 357_4 on an opposite surface of the redistribution dielectric layer 357_6 (e.g., a lower surface of the redistribution dielectric layer 357_6). Accordingly, the first redistribution pads 357_2 may be on a top surface of the first substrate 300, and the pad wiring layers 324 may be on a bottom surface of the first substrate 300.

In an embodiment, the base layer 310 may include a semiconductor material, glass, ceramic, or plastic. For example, the base layer 310 may include silicon. In some embodiments, the base layer 310 may be formed from a silicon semiconductor substrate. A plurality of first substrate through electrodes 330 connecting the first surface 312 to the second surface 314 may be provided in the base layer 310 and may extend in a thickness direction through the base layer 310. Each of the first substrate through electrodes 330 may include a conductive plug passing through the base layer 310 and a conductive barrier film surrounding the conductive plug. The conductive plug may have a pillar shape, and the conductive barrier film may have a cylindrical shape surrounding the side wall of the conductive plug. In an embodiment, a plurality of via dielectric layers may be disposed between the base layer 310 and the first substrate through electrodes 330 to surround the side walls of the first substrate through electrodes 330.

The redistribution structure 357 may include the redistribution dielectric layer 357_6 and the first and second redistribution pads 357_2 and 357_4, which are respectively on the opposite surfaces of the redistribution dielectric layer 357_6 (e.g., an upper and a lower surface of the redistribution dielectric layer 357_6, respectively). The second redistribution pads 357_4 may be disposed on the first surface 312 of the base layer 310 (e.g., an upper surface of the base layer 310) and electrically connected to the first substrate through electrodes 330. The first substrate through electrodes 330 may electrically connect the second redistribution pads 357_4 to the pad wiring layers 324.

The redistribution structure 357 may further include a plurality of redistribution lines 357_7 and redistribution vias 357_8, which electrically connect the first redistribution pads 357_2 to the second redistribution pads 357_4. Although in the embodiment of FIG. 15, the redistribution lines 357_7 are arranged inside the redistribution dielectric layer 357_6, embodiments are not limited thereto.

For example, in an embodiment, each of the first redistribution pads 357_2, the second redistribution pads 357_4, the redistribution lines 357_7, and the redistribution vias 357_8 may include copper, nickel, stainless steel, or a copper alloy such as beryllium copper. For example, the redistribution dielectric layer 357_6 may include at least one selected from oxide, nitride, and photo imagable dielectric (PID). In some embodiments, the redistribution dielectric layer 357_6 may include silicon oxide, silicon nitride, epoxy, or polyimide.

A first substrate protection layer 355, the pad wiring layers 324, a plurality of first substrate connectors 340, and a plurality of wiring protection layers 356 may be arranged on the second surface 314 of the base layer 310. The pad wiring layers 324 may be disposed on the first substrate protection layer 355 and connected to the first substrate through electrodes 330, which pass through the first substrate protection layer 355. The first substrate connectors 340 may be disposed on the pad wiring layers 324. For example, the first substrate connectors 340 may be disposed on a lower surface of the pad wiring layers 324. The wiring protection layers 356 may surround the first substrate connectors 340 and cover the pad wiring layers 324.

In an embodiment, the first substrate 300 may correspond to an interposer.

A first underfill layer 382 may be disposed between the first semiconductor device 100 and the first substrate 300 (e.g., in a thickness direction), and a second underfill layer 384 may be disposed between the second semiconductor device 200 and the first substrate 300 (e.g., in a thickness direction). In some embodiments, the first underfill layer 382 may protrude from a side surface of the first semiconductor device 100 in the lateral direction (e.g., a horizontal direction). In some embodiments, the second underfill layer 384 may protrude from a side surface of the second semiconductor device 200 in the lateral direction (e.g., a horizontal direction).

In an embodiment, the second substrate 400 may include a base board layer 410, a board top pad 422 on an upper surface of the base board layer 410, and a board bottom pad 424 on a lower surface of the base board layer 410. In some embodiments, the second substrate 400 may include a printed circuit board (PCB). For example, the second substrate 400 may include a multi-layer PCB. In an embodiment, the base board layer 410 may include at least one material selected from phenol resin, epoxy resin, and polyimide.

In an embodiment, a solder resist layer may be disposed on each of the upper and lower surfaces of the base board layer 410 and may expose the board top pad 422 or the board bottom pad 424. A first substrate connector 340 may be connected to the board top pad 422, and a package connector 440 may be connected to the board bottom pad 424. The first substrate connector 340 may electrically connect a pad wiring layer 324 to the board top pad 422. The package connector 440 connected to the board bottom pad 424 may connect the semiconductor package 1000 to the outside. For example, the package connector 440 may electrically connect the semiconductor package 1000 to an external device. A board underfill layer 380 may be disposed between the first substrate 300 and the second substrate 400 (e.g., in a thickness direction). The board underfill layer 380 may surround a plurality of first substrate connectors 340.

The semiconductor package 1000 may further include a package molding layer 800 disposed on the first substrate 300 to surround the side surfaces of the first semiconductor device 100 and the second semiconductor device 200. For example, in an embodiment, the package molding layer 800 may include an epoxy molding compound.

In some embodiments, the package molding layer 800 may cover the top surface of the first substrate 300 and the side surface of each of the first semiconductor device 100 and the second semiconductor device 200 but not the top surface of each of the first semiconductor device 100 and the second semiconductor device 200. In this embodiment, the semiconductor package 1000 may further include a heat dissipation unit 950 covering the top surfaces of the first semiconductor device 100 and the second semiconductor device 200. The heat dissipation unit 950 may include a heat slug or a heat sink. In some embodiments, the heat dissipation unit 950 may be disposed on a top surface of the second substrate 400 to surround the first semiconductor device 100, the second semiconductor device 200, and the top and side surfaces of the first substrate 300. In some embodiments, the heat dissipation unit 950 may include a metal material and have a flat or solid shape.

The semiconductor package 1000 may further include a thermal interface material (TIM) 900 disposed between the heat dissipation unit 950 and each of the first semiconductor device 100 and the second semiconductor device 200. For example, as shown in the embodiment of FIG. 15, the TIM may be disposed directly on upper surfaces of each of the first semiconductor device 100 and the second semiconductor device 200. In an embodiment, the TIM may also be disposed on an upper surface of the package molding layer 800. In an embodiment, the TIM 900 may be provided as a paste or a film.

While the present inventive concepts have been particularly shown and described with reference to embodiments thereof, it will be understood that various changes in form and details may be made therein without departing from the spirit and scope of the present inventive concepts.

What is claimed is:

1. A semiconductor device comprising:
a semiconductor substrate having a semiconductor device on an active surface thereof, the semiconductor substrate having a quadrangular plane;
an insulating layer disposed directly on the active surface of the semiconductor substrate; and
a passivation layer on the insulating layer,
wherein the insulating layer includes:
an insulating layer central portion having a side surface extending in parallel with a side surface of the semiconductor substrate, the side surface of the insulating layer central portion is spaced apart from the side surface of the semiconductor substrate by a first size; and
an insulating layer corner portion at each corner of the insulating layer central portion and protruding from the side surface of the insulating layer central portion in a horizontal direction, and
the passivation layer covers the insulating layer central portion.

2. The semiconductor device of claim 1,
wherein an inside of the insulating layer central portion includes at least one wiring layer.

3. The semiconductor device of claim 2,
wherein an inside of the insulating layer corner portion does not include a wiring layer.

4. The semiconductor device of claim 1,
wherein the insulating layer corner portion includes at least one side surface aligned with the side surface of the semiconductor substrate.

5. The semiconductor device of claim 4,
wherein a width of the at least one side surface of the insulating layer corner portion is greater than or equal to the first size.

6. The semiconductor device of claim 5,
wherein the insulating layer central portion includes a same material as the insulating layer corner portion.

7. The semiconductor device of claim 5,
wherein the insulating layer central portion is integrally formed with the insulating layer corner portion.

8. The semiconductor device of claim 1,
wherein the first size is in a range of about 4 μm to about 20 μm.

9. The semiconductor device of claim 1,
wherein a side surface of the passivation layer is at least partially aligned with a side surface of the insulating layer.

10. The semiconductor device of claim 9, wherein;
the passivation layer extends on the insulating layer and covers the insulating layer corner portion, and
the side surface of the passivation layer is aligned with a corresponding side surface of the insulating layer corner portion.

11. A semiconductor package comprising:
a semiconductor substrate;
an insulating layer disposed directly on the semiconductor substrate and covering an active surface of the semiconductor substrate, the insulating layer having a protrusion at each of four corners thereof, the protrusion protruding in a horizontal direction; and
a passivation layer at least partially covering the insulating layer,
wherein at least a portion of an edge of the protrusion is aligned with an edge of the semiconductor substrate.

12. The semiconductor package of claim 11,
wherein the protrusion includes an insulating layer vertex at which two edges of the protrusion meet, the two edges of the protrusion are respectively aligned with two edges of the semiconductor substrate and respectively extend in parallel with the two edges of the semiconductor substrate.

13. The semiconductor package of claim 12,
wherein the insulating layer vertex is aligned with a vertex of the semiconductor substrate.

14. The semiconductor package of claim 12,
wherein the protrusion further includes a sub-edge adjacent to a first edge of the two edges of the protrusion, the sub-edge extending in a direction perpendicular to the first edge of the two edges of the protrusion.

15. The semiconductor package of claim 12,
wherein the protrusion further includes a sub-edge adjacent to a first edge of the two edges of the protrusion, the sub-edge forming a curve.

16. The semiconductor package of claim 15,
wherein the sub-edge includes a concave curve.

17. The semiconductor package of claim 12,
wherein the insulating layer includes an edge that is spaced apart from one of the two edges of the semiconductor substrate toward a center of the insulating layer by a first size.

18. The semiconductor package of claim 17,
wherein a length of at least one of the two edges of the protrusion is in a range of about 1.1 to about 4.5 times the first size, the two edges of the protrusion respectively extending in parallel with the two edges of the semiconductor substrate.

19. The semiconductor package of claim 12,
wherein the protrusion further includes a sub-edge adjacent to a first edge of the two edges of the protrusion, the sub-edge forming a curve;
the insulating layer includes an edge spaced apart from one of the two edges of the semiconductor substrate toward a center of the insulating layer by a first size; and
the sub-edge is continuously connected, as a smooth curve, to the edge of the insulating layer, the edge of the insulating layer is spaced apart from the one of the two edges of the semiconductor substrate towards the center of the insulating layer by the first size, and is positioned at an obtuse angle or a right angle with respect to the one of the two edges of the protrusion.

20. A semiconductor package comprising:
a semiconductor substrate having a semiconductor device on an active surface thereof, the semiconductor substrate having a quadrangular plane;
an insulating layer disposed directly on the active surface of the semiconductor substrate and including a wiring layer electrically connected to the semiconductor device;
a passivation layer on the insulating layer and exposing a connection pad electrically connected to the wiring layer;
a connector on the connection pad; and
a package molding layer covering at least a portion of the semiconductor substrate, wherein the insulating layer includes:
an insulating layer central portion having a side surface extending in parallel with a side surface of the semiconductor substrate, the side surface of the insulating layer central portion is spaced apart from the side surface of the semiconductor substrate by a first size; and
an insulating layer corner portion at each corner of the insulating layer central portion, protruding from the side surface of the insulating layer central portion, and having a side surface aligned with the side surface of the semiconductor substrate, and
the passivation layer covers the insulating layer central portion and the insulating layer corner portion and has a side surface aligned with a side surface of the insulating layer.

* * * * *